US011897081B2

(12) United States Patent
Takami et al.

(10) Patent No.: US 11,897,081 B2
(45) Date of Patent: Feb. 13, 2024

(54) METHOD FOR POLISHING SILICON SUBSTRATE AND POLISHING COMPOSITION SET

(71) Applicant: FUJIMI INCORPORATED, Kiyosu (JP)

(72) Inventors: Shinichiro Takami, Kiyosu (JP); Yusuke Kawasaki, Kiyosu (JP)

(73) Assignee: FUJIMI INCORPORATED, Kiyosu (JP)

( * ) Notice: Subject to any disclaimer, the term of this patent is extended or adjusted under 35 U.S.C. 154(b) by 269 days.

(21) Appl. No.: 16/080,960

(22) PCT Filed: Feb. 13, 2017

(86) PCT No.: PCT/JP2017/005140
§ 371 (c)(1),
(2) Date: Aug. 29, 2018

(87) PCT Pub. No.: WO2017/150158
PCT Pub. Date: Sep. 8, 2017

(65) Prior Publication Data
US 2019/0061095 A1  Feb. 28, 2019

(30) Foreign Application Priority Data
Mar. 1, 2016 (JP) .................................. 2016-039066

(51) Int. Cl.
| | |
|---|---|
| *B24B 37/04* | (2012.01) |
| *C09G 1/02* | (2006.01) |
| *C09K 3/14* | (2006.01) |
| *H01L 21/02* | (2006.01) |
| *H01L 21/306* | (2006.01) |
| *B24B 37/00* | (2012.01) |

(52) U.S. Cl.
CPC ............ *B24B 37/044* (2013.01); *B24B 37/00* (2013.01); *C09G 1/02* (2013.01); *C09K 3/1409* (2013.01); *H01L 21/02013* (2013.01); *H01L 21/02024* (2013.01); *H01L 21/30625* (2013.01)

(58) Field of Classification Search
CPC . B24B 37/044; B24B 37/00; H01L 21/02013; H01L 21/02024
USPC .......................................................... 451/41
See application file for complete search history.

(56) References Cited

U.S. PATENT DOCUMENTS

| | | | |
|---|---|---|---|
| 5,182,119 A | 1/1993 | Edens | |
| 7,204,865 B2* | 4/2007 | Yamada | ................... C09G 1/02 106/3 |
| 2006/0264157 A1 | 11/2006 | Hashii et al. | |
| 2007/0175104 A1* | 8/2007 | Nishiyama | ........ H01L 21/31053 257/E21.244 |
| 2010/0080956 A1* | 4/2010 | Fujimoto | ................ C30B 25/02 428/141 |
| 2011/0130073 A1* | 6/2011 | Furukawa | ............. H01L 21/304 451/6 |
| 2011/0217845 A1* | 9/2011 | Takahashi | ................ C09G 1/02 438/693 |
| 2013/0095660 A1 | 4/2013 | Tanimoto et al. | |
| 2014/0141613 A1* | 5/2014 | Heilmaier | ......... H01L 21/02024 438/693 |
| 2015/0079789 A1* | 3/2015 | Mori | .................... C09K 3/1463 438/693 |
| 2016/0001416 A1 | 1/2016 | Tsuchiya et al. | |
| 2016/0189973 A1 | 6/2016 | Tabata et al. | |
| 2022/0305611 A1* | 9/2022 | Jung | ...................... B24B 57/02 |
| 2023/0047113 A1* | 2/2023 | Ahn | ...................... H01L 21/304 |

FOREIGN PATENT DOCUMENTS

| | | | | |
|---|---|---|---|---|
| CN | 102089121 | A | 6/2011 | |
| CN | 102190961 | A | 9/2011 | |
| EP | 1261020 | A1 * | 11/2002 | .......... B24B 37/345 |
| JP | 2005-187616 | A | 7/2005 | |
| JP | 2006-324417 | A | 11/2006 | |
| JP | 2010-034479 | A | 2/2010 | |
| JP | 2010-135524 | A | 6/2010 | |
| JP | 2011-181765 | A | 9/2011 | |
| JP | 2014-103398 | A | 6/2014 | |
| JP | 2015185672 | A | * 10/2015 | |
| TW | 201421561 | A | 6/2014 | |
| WO | WO 2010/013390 | A1 | 2/2010 | |
| WO | WO-2012/002525 | A1 | 1/2012 | |

(Continued)

OTHER PUBLICATIONS

JP-2015185672-A English Translation (Year: 2015).*
Final polisher PNX332B [online]. Okamoto, [retrieved on Nov. 18, 2021]. Retrieved from the Internet: < URL: www.okamotoen.com/polishing-machine> (Year: 2021).*
Translation of WO 2015046090 Obtained in Nov. 15, 2022 (Year: 2022).*
Office Action from Japanese Application No. 2018-503007 dated Oct. 15, 2020.
Office Action issued in corresponding Taiwanese Application No. 106106215 dated Dec. 25, 2020.

(Continued)

*Primary Examiner* — Bryan R Muller
*Assistant Examiner* — Dana Lee Poon
(74) *Attorney, Agent, or Firm* — Foley & Lardner LLP

(57) ABSTRACT

Provided are a polishing method that can be commonly applied to different types of silicon substrates varying in resistivity as well as a polishing composition set used in the polishing method. The silicon substrate polishing method provided by this invention comprises supplying a first polishing slurry $S_1$ and a second polishing slurry $S_2$ to a silicon substrate to be polished, switching them in this order midway through polishing the silicon substrate. The first polishing slurry $S_1$ comprises an abrasive $A_1$ and a water-soluble polymer $P_1$. The polishing removal rate of the first polishing slurry $S_1$ is higher than that of the second polishing slurry $S_2$.

13 Claims, No Drawings

(56) References Cited

FOREIGN PATENT DOCUMENTS

| WO | WO-2014/129408 A1 | 8/2014 |
|---|---|---|
| WO | WO-2015/019706 A1 | 2/2015 |
| WO | WO-2015/046090 A | 4/2015 |

OTHER PUBLICATIONS

Office Action issued in corresponding Chinese Patent Application No. 202010079054.7 dated Jul. 2, 2021 with English translation.
Office Action issued in corresponding Japanese Application No. 2018-503007 dated Jun. 3, 2021 with English translation.
Office Action issued in corresponding Chinese Patent Application No. 201780014728.1 dated Jul. 19, 2022 with English Translation (20 pages).
Office Action issued in corresponding Japanese Application No. 2021-142978 with English Machine Translation dated Sep. 15, 2022 (8 pages).
Office Action issued in corresponding Chinese Patent Application No. 201780014728.1, dated Feb. 26, 2023 (16 pages).
Notice of Reexamination in corresponding Chinese application No. 201780014728.1 dated Nov. 8, 2023 (18 pages).
Office Action in corresponding Korean application No. 10-2018-7019227 dated Nov. 20, 2023 (21 pages).

\* cited by examiner

METHOD FOR POLISHING SILICON SUBSTRATE AND POLISHING COMPOSITION SET

TECHNICAL FIELD

The present invention relates to a method for polishing different types of silicon substrates varying in resistivity and a polishing composition set used in the polishing method. The present application claims priority to Japanese Patent Application No. 2016-39066 filed on Mar. 1, 2016; and the entire content thereof is herein incorporated by reference.

BACKGROUND ART

The surface of a silicon substrate used in manufacturing of a semiconductor product is generally polished to a high-quality mirror finish via a lapping step (rough polishing step) and a polishing step (fine polishing step). The polishing step typically includes a stock polishing step and a final polishing step. Technical literatures related to silicon wafer polishing include Patent Documents 1 to 3.

CITATION LIST

Patent Literature

[Patent Document 1] WO2010/013390
[Patent Document 2] Japanese Patent Application Publication No. 2014-103398
[Patent Document 3] Japanese Patent Application Publication No. 2006-324417

SUMMARY OF INVENTION

Technical Problem

Lately, there is an increasing demand for low resistivity silicon wafers. Low resistivity silicon wafers are mirror-finished via, for instance, lapping and polishing as described above; silicon epitaxial layers are then grown on their surfaces; and they are used as substrates in producing power semiconductor devices, etc. In general, these low resistivity silicon wafers are heavily doped with dopants. As for dopants, boron is used in p-type silicon wafers. Phosphorous, arsenic, and the like are used in n-type silicon wafers.

Such low resistivity silicon wafers are known to have properties that make them harder to polish than typical silicon wafers. Here, a typical silicon wafer generally has a resistivity of 1 $\Omega \cdot cm$ or greater and 100 $\Omega$ or less, typically a resistivity of about 10 $\Omega \cdot cm$. The level of ease of polishing varies among low resistivity silicon wafers. Silicon wafers with lower resistivity (with higher dopant concentrations) tend to be harder to polish.

Currently, for polishing different types of silicon wafers varying in resistivity, different polishing processes are applied to the respective types of silicon wafers so as to efficiently obtain desirable surface quality. For instance, these processes are carried out with at least some changes made in features used, such as polishing slurries, polishing machine, polishing conditions (e.g. polishing time) and so forth.

An objective of the present invention is thus to provide a polishing method that can be commonly applied to different types of silicon substrates varying in resistivity. Another related objective is to provide a polishing composition set that can be preferably used in such a polishing method.

Solution to Problem

The polishing method provided by this description includes supplying a first polishing slurry $S_1$ and a second polishing slurry $S_2$ to a silicon substrate to be polished, switching them in this order midway through polishing the silicon substrate. Here, the first polishing slurry $S_1$ comprises an abrasive $A_1$ and a water-soluble polymer $P_1$. As the first polishing slurry $S_1$, a polishing slurry whose polishing removal rate is higher than that of the second polishing slurry $S_2$ is used.

According to such a polishing method, it is possible to adequately reduce surface roughness of different types of silicon substrates varying in resistivity, respectively. Thus, the polishing method can be applied to efficiently produce different types of silicon substrates varying in resistivity. The polishing method may be useful in simplifying the polishing system in manufacturing different types of silicon substrates as well as in increasing the operating rate of the polishing machine.

In a preferable embodiment of the polishing method disclosed herein, the first polishing slurry $S_1$ includes at least 0.001% (by weight) water-soluble polymer $P_1$. According to such an embodiment, even when a silicon substrate with high resistivity (e.g. 1 $\Omega \cdot cm$ or higher) is polished in the same polishing process as silicon substrates with low resistivity (e.g. lower than 0.005 $\Omega \cdot cm$), surface roughness of the high resistivity silicon substrate can be favorably reduced.

In an embodiment of the polishing method disclosed herein, the water-soluble polymer $P_1$ preferably has a vinyl alcohol-based polymer chain. In such an embodiment, the effect of this invention can be favorably obtained.

In another embodiment of the polishing method disclosed herein, the water-soluble polymer $P_1$ preferably includes an N-vinyl-based polymer chain. With the first polishing slurry $S_1$ including such a water-soluble polymer $P_1$, even when a silicon substrate with high resistivity is polished in the same polishing process as silicon substrates with low resistivity, surface roughness of the high resistivity silicon substrate can be favorably reduced. The polishing process that can favorably reduce surface roughness of the high resistivity silicon substrate can also be applied to a low resistivity silicon substrate to efficiently polish the low resistivity silicon substrate.

In a preferable embodiment of the polishing method disclosed herein, the first polishing slurry $S_1$ includes an alkali metal hydroxide as a basic compound $B_1$. According to such an embodiment, even when a silicon substrate with high resistivity is polished in the same polishing process as silicon substrates with low resistivity, surface roughness of the high resistivity silicon substrate can be favorably reduced. The polishing process that can favorably reduce surface roughness of the high resistivity silicon substrate can also be applied to a low resistivity silicon substrate to efficiently polish the low resistivity silicon substrate.

As the second polishing slurry $S_2$ in the polishing method disclosed herein, a slurry comprising an abrasive $A_2$ and a water-soluble polymer $P_2$ is preferably used. The concentration of water-soluble polymer $P_2$ in the second polishing slurry $S_2$ is preferably higher than the concentration of water-soluble polymer $P_1$ in the first polishing slurry $S_1$. With the use of such second polishing slurry $S_2$, high-quality surfaces can be efficiently obtained with respect to different types of silicon substrates varying in resistivity.

In an embodiment where the second polishing slurry $S_2$ includes an abrasive $A_2$, the abrasive $A_2$ content is preferably 0.5% by weight or lower. According to such second polishing slurry $S_2$, higher-quality surfaces can be efficiently obtained with respect to different types of silicon substrates varying in resistivity.

In a preferable embodiment of the polishing method disclosed herein, the abrasive $A_1$ in the first polishing slurry $S_1$ has a BET diameter smaller than 60 nm. According to such an embodiment, higher-quality surfaces can be efficiently obtained with respect to different types of silicon substrates varying in resistivity. The abrasive $A_2$ in the second polishing slurry $S_2$ also preferably has a BET diameter smaller than 60 nm.

The polishing method disclosed herein can adequately reduce surface roughness of different types of silicon substrates varying in resistivity, respectively. Thus, for instance, it can be commonly applied to polishing different types of silicon substrates with resistivity varying by a factor of 100 or greater. In a preferable embodiment, the different types of silicon substrates may include a silicon substrate having a resistivity of 1 Ω·cm or greater and a silicon substrate having a resistivity less than 0.005 Ω·cm. The polishing method disclosed herein can be preferably applied to polishing (e.g. final polishing) of these silicon substrates.

The present description also provides a polishing composition set used in a polishing method disclosed herein. The polishing composition set comprises the first polishing slurry $S_1$ or a first composition $Q_1$ which is a concentrate of $S_1$, and the second polishing slurry $S_2$ or a second composition $Q_2$ which is a concentrate of $S_2$. Here, the first composition $Q_1$ and the second composition $Q_2$ are separately stored. The polishing method disclosed herein can be favorably practiced, using a polishing composition set having such a make-up.

Matters disclosed by the present description include a polishing composition used in a polishing method disclosed herein, the polishing composition being the first polishing slurry $S_1$ or a concentrate thereof. For instance, the polishing composition can be preferably used as the first composition $Q_1$ constituting the polishing composition set disclosed herein.

Matters disclosed by this description include a polishing composition used in a polishing method disclosed herein, the polishing composition being the second polishing slurry $S_2$ or a concentrate thereof. For instance, the polishing composition can be preferably used as the second composition $Q_2$ constituting the polishing composition set disclosed herein.

DESCRIPTION OF EMBODIMENTS

Preferred embodiments of the present invention are described below. Matters necessary to implement this invention other than those specifically referred to in this description may be understood as design matters to a person of ordinary skill in the art based on the conventional art in the pertinent field. The present invention can be implemented based on the contents disclosed in this description and common technical knowledge in the subject field.

The art disclosed herein can be applied to a polishing process whose polishing object is a silicon substrate. In particular, it is favorable in a polishing process whose polishing object is a silicon wafer. A typical example of the silicon wafer here is a monocrystalline silicon wafer, for instance, a slice of monocrystalline silicon ingot. In the art disclosed herein, the polishing surface (surface to be polished) is typically formed from silicon.

The polishing method disclosed herein can be preferably applied to a polishing step for silicon substrates. Before the polishing step disclosed herein, the silicon substrates may be subjected to a general treatment that can be applied to silicon substrates in an earlier step than the polishing step, such as lapping and etching In the following, regardless of which polishing sub-step uses the polishing slurry of interest, for instance, regardless whether it is the first polishing slurry $S_1$ or the second polishing slurry $S_2$, the term "polishing slurry" may be used, referring to polishing slurries in general that are used in the polishing method disclosed herein.

The polishing method disclosed herein includes a polishing step in which, to a silicon substrate to be polished, the first polishing slurry $S_1$ and the second polishing slurry $S_2$ are supplied, switched in this order midway through polishing the silicon substrate. The polishing step is carried out in an embodiment where a first sub-step (first polishing sub-step) where a polishing object is polished with the first polishing slurry $S_1$ and a second sub-step (second polishing sub-step) where the polishing object is polished with the second polishing slurry $S_2$ are performed in this order, typically on one same platen. In other words, the first sub-step and the second sub-step are carried out without moving the polishing object to another polishing machine or to another platen in the middle of the step. The first sub-step and the second sub-step are performed on the same polishing object, sub-step by sub-step (i.e. sequentially). However, in each polishing sub-step, it is allowed to polish several polishing objects simultaneously or in parallel, that is, to carry out batch-polishing.

<First Polishing Slurry $S_1$>

The first polishing slurry $S_1$ comprises an abrasive $A_1$ and a water-soluble polymer $P_1$, and typically further comprises water.

(Abrasive $A_1$)

The abrasive works to mechanically polish the surface of silicon substrates. The first polishing slurry $S_1$ in the art disclosed herein comprises an abrasive $A_1$. The material and properties of the abrasive $A_1$ are not particularly limited and can be suitably selected in accordance with its purpose and application. Examples of the abrasive $A_1$ include inorganic particles, organic particles and organic/inorganic composite particles. Specific examples of inorganic particles include oxide particles such as silica particles, alumina particles, cerium oxide particles, chromium oxide particles, titanium dioxide particles, zirconium oxide particles, magnesium oxide particles, manganese dioxide particles, zinc oxide particles, and red oxide particles; nitride particles such as silicon nitride particles and boron nitride particles; carbide particles such as silicon carbide particles and boron carbide particles; diamond particles; and carbonates such as calcium carbonate and barium carbonate. Specific examples of organic particles include poly(methyl methacrylate) (PMMA) particles and polyacrylonitrile particles. In particular, inorganic particles are preferable. As the abrasive $A_1$, solely one kind or a combination of two or more kinds can be used.

As the abrasive $A_1$, inorganic particles are preferable. In particular, particles formed of an oxide of a metal or metalloid are preferable. Silica particles are particularly preferable. The art disclosed herein can be preferably practiced in an embodiment where the abrasive $A_1$ in the first polishing slurry $S_1$ is substantially formed of silica particles. Here, the term "substantially" is used here to indicate that the silica particles account for 95% by weight or more (preferably 98% by weight or more, more preferably 99% by weight or more, or possibly 100% by weight) of the particles forming the abrasive $A_1$.

Specific examples of silica particles include colloidal silica, fumed silica and precipitated silica. For the silica particles, solely one kind or a combination of two or more kinds can be used. Colloidal silica is particularly preferable as it is less likely to cause scratches on the surface of the polishing object while it can exhibit great polishing abilities. As the colloidal silica, for instance, colloidal silica prepared by ion exchange of liquid glass (sodium silicate) as the starting material and alkoxide-based colloidal silica can be preferably used. Here, the alkoxide-based colloidal silica refers to colloidal silica produced by hydrolysis and condensation reactions of an alkoxysilane. For the colloidal silica, solely one kind or a combination of two or more kinds can be used.

The silica forming the silica particles has a true specific gravity of preferably 1.5 or higher, more preferably 1.6 or higher, or yet more preferably 1.7 or higher. With increasing true specific gravity of the silica, the polishing removal rate tends to increase. From such a standpoint, particularly preferable silica particles have a true specific gravity of 2.0 or higher, for instance, 2.1 or higher. The maximum true specific gravity of the silica is not particularly limited. It is typically 2.3 or lower, for instance, 2.2 or lower. As the true specific gravity of the silica, the value measured by a liquid displacement method using ethanol as the displacing liquid can be used.

The BET diameter of the abrasive particles (typically silica particles) $A_1$ in the first polishing slurry $S_1$ is not particularly limited. From the standpoint of the removal rate of polishing, etc., the BET diameter is preferably 5 nm or greater, more preferably 10 nm or greater, or particularly preferably 20 nm or greater, for instance, 25 nm or greater. From the standpoint of obtaining greater polishing effect, it is preferable to use an abrasive $A_1$ having a BET diameter greater than 30 nm. For instance, an abrasive $A_1$ having a BET diameter of 32 nm or greater can be preferably used. From the standpoint of preventing scratches, etc., the BET diameter of the abrasive $A_1$ is preferably 100 nm or less, more preferably 80 nm or less, or yet more preferably 70 nm or less, for instance, 60 nm or less. The art disclosed herein can be implemented in an embodiment where the BET diameter of the abrasive $A_1$ is preferably less than 60 nm, more preferably 55 nm or less, or yet more preferably 45 nm or less, for instance, 40 nm or less. By carrying out polishing (typically final polishing) using the first polishing slurry $S_1$ comprising such abrasive $A_1$, high-quality surfaces can be efficiently obtained with respect to different types of silicon substrates varying in resistivity.

As used herein, the BET diameter refers to the particle diameter determined from the specific surface area (BET value) which is measured by a BET method, according to the next equation: BET diameter (nm)=6000/(true density (g/cm$^3$)×BET value (m$^2$/g). For instance, with respect to silica particles, the BET diameter can be determined by BET diameter (nm)=2727/BET value (m$^2$/g). The specific surface area can be determined using, for instance, a specific surface area analyzer under trade name Flow Sorb II 2300 available from Micromeritics.

The shape (outer shape) of the abrasive $A_1$ may be a globular shape or a non-globular shape. Specific examples of non-globular shapes of the abrasive include a peanut shape (i.e. peanut shell shape), cocoon shape, conpeito shape (spiky ball shape), rugby ball shape, and so on. For instance, abrasive $A_1$ mostly comprising peanut-shaped particles can be preferably used.

While no particular limitations are imposed, the average value of major axis to minor axis ratio (i.e. average aspect ratio) of the abrasive $A_1$ is theoretically 1.0 or higher, more preferably 1.05 or higher, or yet more preferably 1.1 or higher. With increasing the average aspect ratio, higher polishing removal rate can be achieved. From the standpoint of scratch reduction and so on, the average aspect ratio of the abrasive $A_1$ is preferably 3.0 or lower, more preferably 2.0 or lower, or yet more preferably 1.5 or lower.

The shape (outer shape) and the average aspect ratio of the abrasive $A_1$ can be determined, for instance, by electron microscopy observation. In particular, the average aspect ratio is determined, for instance, by the following procedure: By scanning electron microscopy (SEM), with respect to a prescribed number (e.g. 200) of silica particles whose shapes can be separately recognized, the smallest rectangle is drawn to circumscribe each particle image. With respect to the rectangle drawn for each particle image, the long side (major axis) is divided by the short side (minor axis) to determine the major axis/minor axis ratio (aspect ratio). The aspect ratios of the prescribed number of particles can be arithmetically averaged to determine the average aspect ratio.

The content of the abrasive $A_1$ in the first polishing slurry $S_1$ is not particularly limited. In an embodiment, the content of the abrasive $A_1$ is preferably 0.05% by weight or higher, or more preferably 0.1% by weight or higher, for instance, 0.2% by weight or higher. With increasing the content of the abrasive $A_1$, higher polishing removal rate can be achieved. From the standpoint of the ease of its removal from polishing objects, etc., the content of the abrasive is usually suitably 10% by weight or lower, preferably 7% by weight or lower, more preferably 5% by weight or lower, or yet more preferably 3% by weight or lower, for instance, 2% by weight or lower.

(Water)

The first polishing slurry $S_1$ typically includes water. As the water in the polishing composition disclosed herein, ion-exchanged water (deionized water), pure water, ultra-pure water, distilled water and the like can be preferably used. To avoid hindering the effect of other components in the first polishing slurry $S_1$ whenever possible, the water to be used preferably includes a total of, for instance, 100 ppb transition metal ion(s) or less. For example, the purity of the water can be increased by operations such as removing impurity ions with ion-exchange resin, removing contaminants with a filter, distillation, and so on.

(Water-Soluble Polymer $P_1$)

The first polishing slurry $S_1$ includes a water-soluble polymer $P_1$. As the water-soluble polymer $P_1$, it is possible to use solely one kind of polymer having at least one kind of functional group in its molecule, selected among cationic groups, anionic groups and nonionic groups; or a combination of two or more such polymer kinds. In particular, for instance, as the water-soluble polymer $P_1$, one, two or more kinds of polymer can be used, selected among polymers having a hydroxy group, carboxy group, acyloxy group, sulfo group, primary amide structure, heterocyclic structure, vinyl structure, polyoxyalkylene structure and so on in molecules. From the standpoint of reducing aggregates and facilitating rinsing, etc., a nonionic polymer can be preferably used as the water-soluble polymer $P_1$.

Non-limiting examples of the polymer that can be used as the water-soluble polymer $P_1$ include a vinyl alcohol-based polymer (e.g. poly(vinyl alcohol)), a cellulose derivative (e.g. hydroxyethyl cellulose), a starch derivative, a polymer including an oxyalkylene unit, and a polymer including nitrogen atoms. Non-limiting examples of the N-containing polymer include a polymer that includes an N-vinyl monomeric unit such as N-vinyllactam and acyclic N-vinylamide; an imine derivative; and a polymer that includes an N-(meth)acryloyl monomeric unit.

In a preferable embodiment of the art disclosed herein, the water-soluble polymer $P_1$ includes at least a vinyl alcohol-based polymer chain. By carrying out the first-sub-step polishing using such first polishing slurry $S_1$, surface roughness of different types of silicon substrates varying in resistivity can be efficiently reduced.

As used herein, the term "vinyl alcohol-based polymer chain" refers to a polymer chain whose primary repeat unit is the vinyl alcohol unit (or the VA unit hereinafter). As used herein, the primary repeat unit refers to a repeat unit that accounts for at least 50% by weight of the content unless otherwise noted. The VA unit refers to the structural moiety corresponding to the structure formed upon polymerization of the vinyl group in vinyl alcohol ($CH_2$=CH—OH). In particular, the VA unit is the structural moiety represented by chemical formula —$CH_2$—CH(OH)—. VA units may form upon hydrolysis (saponification) of the repeat unit having a structure (—$CH_2$—CH(OCOCH$_3$)—) obtained by vinyl polymerization of vinyl acetate. Hereinafter, the vinyl alcohol-based polymer chain may be referred to as "polymer chain A."

As used herein, the concept of polymer chain encompasses a polymer chain forming one whole polymer molecule and a polymer chain forming part of a polymer molecule.

The polymer chain A may include only the VA unit as its repeat unit or a non-VA repeat unit (or a "non-VA unit" hereinafter) in addition to the VA unit. In an embodiment where the polymer chain A includes a non-VA unit, the non-VA unit can be, for instance, a repeat unit having at least one structure selected among ethylene oxide group, carboxy group, sulfo group, amino group, hydroxy group, amide group, imide group, nitrile group, ether group, ester group and salts of these. The polymer chain A may include only one kind of non-VA unit or two or more kinds of non-VA units.

Favorable examples of the non-VA unit that can be in the polymer chain A include a vinyl monocarboxylate unit, that is, a repeat unit derived from a monocarboxylic acid vinyl ester. Preferable specific examples of the vinyl monocarboxylate unit include the vinyl acetate unit, vinyl propionate unit and vinyl hexanoate unit.

The ratio of the number of moles of VA units in the number of moles of all repeat units forming the polymer chain A is typically 50% or higher, usually suitably 65% or higher, or preferably 75% or higher, for instance, 80% or higher. In a preferable embodiment, the ratio of the number of moles of VA units in the number of moles of all repeat units forming the polymer chain A can be 90% or higher (more preferably 95% or higher, e.g. 98% or higher). Substantially 100% of repeat units forming the polymer chain A can be the VA unit. Here, "substantially 100%" means that non-VA units are not included at least intentionally in the polymer chain A.

The VA unit content (by weight) in the polymer chain A is typically higher than 50% by weight, or preferably 70% by weight or higher. Hereinafter, a polymer chain A with at least 70% VA unit by weight may be referred to as a "PVA chain." In a preferable embodiment, the VA unit content in the polymer chain A can be preferably 80% by weight or higher, more preferably 90% by weight or higher, or yet more preferably 95% by weight or higher, for instance, 98% by weight or higher. Substantially 100% by weight of repeat units forming the polymer chain A can be the VA unit. Here, "substantially 100% by weight" means that non-VA units are not included at least intentionally as repeat units forming the polymer chain A.

In place of or in addition to the polymer chain A, the water-soluble polymer $P_1$ may include a polymer chain that is not a polymer chain A. Here, the polymer chain that is not a polymer chain A refers to a polymer chain whose primary repeat unit is a non-VA unit. Hereinafter, the polymer chain that is not a polymer chain A may be referred to as a "polymer chain B."

The non-VA unit forming the polymer chain B can be a repeat unit having at least one structure selected among ethylene oxide group, carboxy group, sulfo group, amino group, hydroxy group, amide group, imide group, nitrile group, ether group, ester group and salts of these. A favorable example of the polymer chain B is a polymer chain including an N-vinyl-based monomeric unit described later. In particular, a polymer chain whose primary repeat unit is an N-vinyl-based monomeric unit is preferable. Hereinafter, a polymer chain whose primary repeat unit is an N-vinyl-based monomeric unit may be referred to as an "N-vinyl-based polymer chain."

In a preferable embodiment of the art disclosed herein, the water-soluble polymer $P_1$ may include a water-soluble polymer $P_A$ having a polymer chain A in combination with a water-soluble polymer $P_B$ having a polymer chain B. In other words, the water-soluble polymer $P_1$ possibly included in the first polishing slurry $S_1$ can be a mixture of a water-soluble polymer $P_A$ and a water-soluble polymer $P_B$.

Non-limiting examples of the water-soluble polymer $P_B$ include a cellulose derivative, a starch derivative, a polymer including an oxyalkylene unit and a polymer including nitrogen atoms. Non-limiting examples of the N-containing polymer include a polymer that includes an N-vinyl monomeric unit such as N-vinyllactam and acyclic N-vinylamide; an imine derivative; and a polymer that includes an N-(meth)acryloyl monomeric unit.

A cellulose derivative (or "polymer $P_{BA}$" hereinafter) is a polymer that comprises a β-glucose unit as the primary repeat unit. Specific examples of the cellulose derivative include hydroxyethyl cellulose, hydroxypropyl cellulose, hydroxyethylmethyl cellulose, hydroxypropylmethyl cellulose, methyl cellulose, ethyl cellulose, ethylhydroxyethyl cellulose, carboxymethyl cellulose, etc. In particular, hydroxyethyl cellulose (HEC) is preferable.

A starch derivative (or "polymer Ns" hereinafter) is a polymer that comprises α-glucose units as its primary repeat units. Specific examples of the starch derivative include alpha starch, pullulan, carboxymethyl starch, and cyclodextrin. In particular, pullulan is preferable.

Examples of polymers containing oxyalkylene units (which may be called "polymers $P_{BC}$" hereinafter) include polyethylene oxide (PEO), block copolymers of ethylene oxide (EO) and propylene oxide (PO) or butylene oxide (BO), and random copolymers of EO and PO or BO. Among them, a block copolymer of EO and PO or a random copolymer of EO and PO are preferable. The block copolymer of EO and PO can be a diblock copolymer or a triblock copolymer comprising PEO blocks and polypropylene oxide (PPO) blocks, or the like. Examples of the tri-block copolymer include PEO-PPO-PEO triblock copolymer and PPO-PEO-PPO triblock copolymer. Typically, PEO-PPO-PEO triblock copolymer is more preferable.

As used herein, the term copolymer comprehensively refers to various types of copolymer such as random copolymer, alternating copolymer, block copolymer, and graft copolymer.

Examples of the N-vinyl monomeric unit-containing polymer (or "polymer $P_{BD}$" hereinafter) include a polymer that includes a repeat unit derived from a monomer having an N-containing heterocycle (e.g. lactam ring). Examples of the polymer $P_{BD}$ include homopolymer of an N-vinyllactam-based monomer and a copolymer thereof (e.g. a copolymer in which the copolymerization ratio of the N-vinyllactam-based monomer exceeds 50% by weight); and a homopolymer of an acyclic N-vinylamide and a copolymer thereof (e.g. a copolymer in which the copolymerization ratio of the acyclic N-vinylamide exceeds 50% by weight).

Specific examples of the N-vinyllactam-based monomer include N-vinylpyrrolidone (VP), N-vinylpiperidone, N-vinylmorpholinone, N-vinylcaprolactam (VC), N-vinyl-1,3-oxazine-2-one, N-vinyl-3,5-morpholinedione, etc. Specific examples of the N-vinyllactam monomeric unit-containing polymer include a polyvinylpyrrolidone, polyvinylcaprolactam, random copolymer of VP and VC, random copolymer of one or each of VP and VC with another vinyl monomer (e.g. acrylic monomer, vinyl ester-based monomer, etc.), block copolymer and graft copolymer comprising a polymer chain with one or each of VP and VC (e.g. a graft copolymer obtained by grafting poly(vinyl alcohol) with polyvinylpyrrolidone).

Specific examples of the open-chain N-vinylamide include N-vinylacetamide, N-vinylpropionic acid amide, and N-vinyllactic acid amide.

The imine derivative (or "polymer $P_{BE}$" hereinafter) includes a homopolymer and a copolymer of an N-acylalkyleneimine-based monomer. Specific examples of the N-acylalkyleneimine-based monomer include N-acetylethyleneimine, N-propionylethyleneimine, N-caproylethyleneimine, N-benzoylethyleneimine, N-acetylpropyleneimine, N-butyrylethyleneimine, etc. As the homopolymer of N-acylalkyleneimine-based monomer, a poly(N-acylalkyleneimine) and the like can be used. Specific examples include poly(N-acetylethyleneimine), poly(N-propionylethyleneimine), poly(N-caproylethyleneimine), poly(N-benzoylethyleneimine), poly(N-acetylpropyleneimine), and poly(N-butyrylethyleneimine) Examples of the copolymer of N-acylalkyleneimine-based monomer include a copolymer of two or more kinds of N-acylalkyleneimine-based monomer and a copolymer of one, two or more kinds of N-acylalkyleneimine-based monomer and other monomer(s).

Examples of the N-(meth)acryloyl monomeric unit-containing polymer (or "polymer $P_{BF}$" hereinafter) include a homopolymer of an N-(meth)acryloyl-based monomer and a copolymer thereof (typically a copolymer in which the copolymerization ratio of N-(meth)acryloyl-based monomer exceeds 50% by weight). Examples of the N-(meth)acryloyl-based monomer include an open-chain amide having an N-(meth)acryloyl group and a cyclic amide having an N-(meth)acryloyl group.

Examples of the acyclic amide having an N-(meth)acryloyl group include acrylamide; N-monoalkylacrylamides such as N-methylacrylamide, N-ethylacrylamide, N-propylacrylamide, N-isopropylacrylamide, N-butylacrylamide, N-isobutylacrylamide, N-tert-butylacrylamide, N-heptylacrylamide, N-octylacrylamide, N-tert-octylacrylamide, N-dodecylacrylamide, N-octadecylacrylamide, etc.; substituted N-monoalkylacrylamides such as N-(2-hydroxyethyl)acrylamide, N-(1,1-dimethyl-2-hydroxyethyl)acrylamide, N-(1-ethyl-hydroxyethyl)acrylamide, N-(2-chloroethyl) acrylamide, N-(2,2,2-trichloro-1-hydroxyethyl)acrylamide, N-(2-dimethylaminoethyl)acrylamide, N-(3-dimethylaminopropyl)acrylamide, N-[3-bis(2-hydroxyethyl)aminopropyl]acrylamide, N-(1,1-dimethyl-2-dimethylaminoethyl) acrylamide, N-(2-methyl-2-phenyl-3-dimethylaminopropyl)acrylamide, N-(2,2-dimethyl-3-dimethylaminopropyl)acrylamide, N-(2-morpholinoethyl)acrylamide, N-(2-amino-1,2-dicyanoethyl)acrylamide, etc.; N-monoalkenylacrylamides such as N-allylacrylamide, etc.; N-monoalkynylacrylamides such as N-(1,1-dimethylpropynyl)acrylamide, etc.; aromatic group-containing acrylamides such as N-phenylacrylamide, N-benzylacrylamide, N-[4-(phenylamino)phenyl]acrylamide, etc.; N-monoalkylolacrylamides such as N-methylolacrylamide, N-ethylolacrylamide, N-propylolacrylamide, etc.; N-alkoxyalkylacrylamides such as N-methoxymethylacrylamide, N-ethoxymethylacrylamide, N-butoxymethylacrylamide, N-isobutoxymethylacrylamide, etc.; N-alkoxyacrylamides such as N-methoxyacrylamide, N-ethoxyacrylamide, N-propoxyacrylamide, N-butoxyacrylamide, etc.; N-acetylacrylamide; N-diacetoneacrylamide; methacrylamide; N-monoalkylmethacrylamides such as N-methylmethacrylamide, N-ethylmethacrylamide, N-propylmethacrylamide, N-isopropylmethacrylamide, N-butylmethacrylamide, N-isobutylmethacrylamide, N-tert-butylmethacrylamide, N-heptylmethacrylamide, N-octylmethacrylamide, N-tert-octylmethacrylamide, N-dodecylmethacrylamide, N-octadecylmethacrylamide, etc.; substituted N-monoalkylmethacrylamides such as N-(2-hydroxyethyl)methacrylamide, N-(1,1-dimethyl-2-hydroxyethyl)methacrylamide, N-(1-ethyl-hydroxyethyl)methacrylamide, N-(2-chloroethyl)methacrylamide, N-(2,2,2-trichloro-1-hydroxyethyl)methacrylamide, N-(2-dimethylaminoethyl)methacrylamide, N-(3-dimethylaminopropyl) methacrylamide, N-[3-bis(2-hydroxyethyl)aminopropyl] methacrylamide, N-(1,1-dimethyl-2-dimethylaminoethyl) methacrylamide, N-(2-methyl-2-phenyl-3-dimethylaminopropyl)methacrylamide, N-(2,2-dimethyl-3-dimethylaminopropyl)methacrylamide, N-(2-morpholinoethyl)methacrylamide, N-(2-amino-1,2-dicyanoethyl)methacrylamide, etc.; N-monoalkenylmethacrylamides such as N-allylmethacrylamide, etc.; N-monoalkynylmethacrylamides such as N-(1,1-dimethylpropynyl)methacrylamide, etc.; aromatic group-containing methacrylamides such as N-phenylmethacrylamide, N-benzylmethacrylamide, N-[4-(phenylamino) phenyl]methacrylamide, etc.; N-monoalkylolmethacrylamides such as N-methylolmethacrylamide, N-ethylolmethacrylamide, N-propylolmethacrylamide, etc.; N-alkoxyalkylmethacrylamides such as N-methoxymethylmethacrylamide, N-ethoxymethylmethacrylamide, N-butoxymethylmethacrylamide, N-isobutoxymethylmethacrylamide, etc.; N-alkoxymethacrylamides such as N-methoxymethacrylamide, N-ethoxymethacrylamide, N-propoxymethacrylamide, N-butoxymethacrylamide, etc.; N-acetylmethacrylamide; and N-diacetonemethacrylamide.

Examples of a polymer comprising a N-(meth)acryloyl group-containing open-chain amide as a monomeric unit include a homopolymer of N-isopropylacrylamide and a copolymer of N-isopropylacrylamide (e.g. a copolymer in which the copolymerization ratio of N-isopropylacrylamide exceeds 50% by weight).

Examples of the N-(meth)acryloyl group-containing cyclic amide include N-acryloylmorpholine, N-acryloylthiomorpholine, N-acryloylpiperidine, N-acryloylpyrrolidine, N-methacryloylmorpholine, N-methacryloylpiperidine, N-methacryloylpyrrolidine, etc. An example comprising an N-(meth)acryloyl group-containing cyclic amide as a monomeric unit is an acryloylmorpholine-based polymer (PACMO). Typical examples of the acryloylmorpholine-based polymer include a homopolymer of N-acryloylmorpholine (ACMO) and a copolymer of ACMO (e.g. a copolymer in which the copolymerization ratio of ACMO exceeds 50% by weight). In the acryloylmorpholine-based polymer, the molar ratio of ACMO units to all the repeat units is usually 50% or higher and suitably 80% or higher (e.g. 90% or higher, typically 95% or higher). Substantially all the repeat units in the water-soluble polymer may be formed with ACMO units.

In an embodiment, as the water-soluble polymer $P_B$, a polymer $P_{BD}$ (i.e. a polymer including an N-vinyl-based monomeric unit) can be preferably used. For instance, it is preferable to use a polymer $P_{BD}$ whose primary repeat unit is derived from an N-vinyllactam-based monomer such as VP and VC. A particularly preferable polymer $P_{BD}$ is a vinylpyrrolidone-based polymer (PVP). Here, the vinylpyrrolidone-based polymer refers to VP homopolymer or VP copolymer. The amount of the VP unit (i.e. the repeat unit derived from vinylpyrrolidone) contained in the vinylpyrrolidone-based polymer is typically greater than 50% by weight, preferably 70% by weight or greater, or more preferably 90% by weight or greater, for instance, 95% by weight or greater. Substantially 100% by weight of repeat units forming the vinylpyrrolidone-based polymer can be the VP unit.

In an embodiment where the water-soluble polymer $P_1$ includes a water-soluble polymer $P_A$ and a water-soluble polymer $P_B$ together, the ratio of the water-soluble polymer $P_A$ in the entire water-soluble polymer $P_1$ can be, for instance, 5% by weight or higher; it is usually suitably 10% by weight or higher, preferably 20% by weight or higher, or more preferably 30% by weight or higher, for instance, 40% by weight or higher. The ratio of the water-soluble polymer $P_A$ is usually suitably 95% by weight or lower, preferably 80% by weight or lower, or more preferably 70% by weight or lower, for instance, 60% by weight or lower. The art disclosed herein can be preferably implemented in an embodiment where the ratio of the water-soluble polymer $P_A$ in the entire water-soluble polymer $P_1$ is 10% by weight or higher and 90% by weight or lower (more preferably 20% by weight or higher and 80% by weight or lower, e.g. 30% by weight or higher and 70% by weight or lower). In such an embodiment, it is possible to favorably obtain the effect to adequately reduce surface roughness of different types of silicon substrates varying in resistivity.

In a preferable embodiment of the art disclosed herein, the water-soluble polymer $P_1$ may include, as the water-soluble polymer $P_A$, a copolymer having a polymer chain A and a polymer chain B in one same molecule. Hereinafter, such a water-soluble polymer $P_A$ may be referred to as a "polymer $P_A$-$P_B$."

A favorable example of the polymer $P_A$-$P_B$ is a block copolymer formed of a polymer chain A and a polymer chain B.

Another favorable example of the polymer $P_A$-$P_B$ is a graft copolymer having a polymer chain A and a polymer chain B. The graft copolymer may have a structure in which a polymer chain A (main chain) is grafted with a polymer chain B (side chain) or a structure in which a polymer chain B (main chain) is grafted with a polymer chain A (side chain). Greater effect tends to be obtained with a graft copolymer having a structure in which a polymer chain A (main chain) is grafted with a polymer chain B (side chain).

Favorable examples of the polymer chain B forming the polymer $P_A$-$P_B$ include a polymer chain whose primary repeat unit is derived from an N-vinyl monomeric unit as well as a polymer chain whose primary repeat unit is derived from an N-(meth)acryloyl-based monomeric unit. In particular, a polymer chain whose primary repeat unit is an N-vinyl-based monomeric unit, that is, an N-vinyl-based polymer chain is preferable. The N-vinyl-based polymer chain can be a polymer chain in which a monomer having an N-containing heterocycle (typically an N-vinyllactam-based monomer) has a copolymerization ratio higher than 50% by weight. For instance, a polymer chain B of which more than 50% by weight is attributed to a repeat unit derived from the N-vinyllactam-based monomer selected among N-vinylpyrrolidone (VP), N-vinylpiperidone and N-vinylcaprolactam (VC) is preferable. For instance, in a polymer chain B, the VP unit content is higher than 50% by weight, or preferably 70% by weight or higher. Hereinafter, a polymer chain B whose VP unit content is 70% by weight or higher may be referred to as a "PVP chain."

In an embodiment of the art disclosed herein, it is preferable to use, as the water-soluble polymer $P_1$, a polymer $P_A$-$P_B$ having a PVP chain as the polymer chain B, that is, a $P_A$-PVP. The VP unit content in the PVP chain forming the $P_A$-PVP is preferably 90% by weight or higher, for instance, 95% by weight or higher, or substantially 100% by weight.

A favorable example of the $P_A$-PVP is a $P_A$-PVP whose polymer chain A is a PVA chain, that is, a PVA-PVP. The VA unit content in the PVA chain forming the PVA-PVP is preferably 90% by weight or higher, for instance, or 95% by weight or higher; or it can be substantially 100% by weight.

As the PVA-PVP, a graft copolymer having a structure in which PVA is the main chain and PVP is grafted as a side chain, that is, a PVA main chain/PVP graft copolymer, is particularly preferable.

The weight average molecular weight (Mw) of the water-soluble polymer $P_A$ is not particularly limited. The Mw of the water-soluble polymer $P_A$ is usually suitably $0.2\times10^4$ or higher, preferably $0.4\times10^4$ or higher, more preferably $1\times10^4$ or higher, or yet more preferably $1.5\times10^4$ or higher. With increasing Mw of the water-soluble polymer $P_A$, the polished surface tends to be smoother. The Mw of the water-soluble polymer $P_A$ is usually suitably $200\times10^4$ or lower, preferably $150\times10^4$ or lower, more preferably $100\times10^4$ or lower, or yet more preferably $50\times10^4$ or lower. With decreasing Mw of the water-soluble polymer $P_A$, switching from the first polishing slurry $S_1$ to the second polishing slurry $S_2$ tends to proceed more smoothly. The Mw of the water-soluble polymer $P_A$ can be $30\times10^4$ or lower, or $20\times10^4$ or lower, for instance, $10\times10^4$ or lower.

When the water-soluble polymer $P_A$ is a block copolymer having a polymer chain A and a polymer chain B, the Mws of the respective polymer chains forming the block copolymer (i.e. the Mw of each of the polymer chains A and B) are not particularly limited. In an embodiment, the Mw of each polymer chain is preferably $0.1\times10^4$ or higher, more preferably $1\times10^4$ or higher, or yet more preferably $1.5\times10^4$ or higher, for instance, $2\times10^4$ or higher. The Mw of each polymer chain is preferably $100\times10^4$ or lower, more preferably $50\times10^4$ or lower, or yet more preferably $30\times10^4$ or lower.

When the water-soluble polymer $P_A$ is a graft copolymer including a polymer chain A and a polymer chain B, the Mws of the respective polymer chains forming the graft copolymer are not particularly limited.

In an embodiment, the Mw of the polymer chain forming the main chain of the graft copolymer is suitably $0.1\times10^4$ or higher (e.g. $0.2\times10^4$ or higher), preferably $0.4\times10^4$ or higher, more preferably $1\times10^4$ or higher, or yet more preferably $1.5 \times 10^4$ or higher. The Mw of the polymer chain forming the main chain is usually suitably $100 \times 10^4$ or lower, preferably $50 \times 10^4$ or lower, more preferably $30 \times 10^4$ or lower, or yet more preferably $20 \times 10^4$ or lower, for instance, $10 \times 10^4$ or lower.

The Mw of the polymer chain forming the side chain of the graft copolymer is suitably $0.1 \times 10^4$ or higher (e.g. $0.2 \times 10^4$ or higher), preferably $1 \times 10^4$ or higher, or more preferably $1.5 \times 10^4$ or higher. The Mw of the polymer chain forming the side chain is usually suitably $100 \times 10^4$ or lower, preferably $50 \times 10^4$ or lower, more preferably $30 \times 10^4$ or lower, or yet more preferably $20 \times 10^4$ or lower, for instance, $10 \times 10^4$ or lower.

In an embodiment where the water-soluble polymer $P_1$ includes a water-soluble polymer $P_B$, the Mw of the water-soluble polymer $P_B$ is not particularly limited. From the standpoint of the ease of filtration and the ease of rinsing, etc., it is possible to use, for instance, a kind having a Mw of $200 \times 10^4$ or lower, preferably $170 \times 10^4$ or lower, or more preferably $150 \times 10^4$ or lower. With increasing Mw of the water-soluble polymer $P_B$, the number of moles in the same amount added decreases, whereby the polishing removal rate tends to increase. From such a standpoint, it is usually suitable to use a water-soluble polymer $P_B$ having a Mw of $0.1 \times 10^4$ or higher. For instance, it is preferable to use a water-soluble polymer $P_B$ having a Mw of $1 \times 10^4$ or higher.

More preferable Mw ranges may also vary depending on the types of water-soluble polymer $P_B$. For instance, the Mws of the water-soluble polymer $P_{BA}$ and water-soluble polymer $P_{BB}$ are typically individually lower than $200 \times 10^4$, preferably $170 \times 10^4$ or lower, or more preferably $150 \times 10^4$ or lower. In an embodiment, the Mws of the water-soluble polymer $P_{BA}$ and water-soluble polymer $P_{BB}$ can be $100 \times 10^4$ or lower, for instance, $50 \times 10^4$ or lower. The Mws of the water-soluble polymer $P_{BA}$ and water-soluble polymer $P_{BB}$ are typically individually $1 \times 10^4$ or higher, preferably $2 \times 10^4$ or higher, more preferably $3 \times 10^4$ or higher, or yet more preferably $5 \times 10^4$ or higher, for instance, $7 \times 10^4$ or higher. In an embodiment, the Mws of the water-soluble polymer $P_{BA}$ and water-soluble polymer $P_{BB}$ can be, for instance, $15 \times 10^4$ or higher, or even $30 \times 10^4$ or higher.

For instance, the Mws of the water-soluble polymer $P_{BC}$, water-soluble polymer $P_{BD}$ and water-soluble polymer $P_{BE}$ are individually preferably $50 \times 10^4$ or lower, or more preferably $30 \times 10^4$ or lower. In an embodiment, the Mws of these water-soluble polymers can be individually $20 \times 10^4$ or lower, or even $10 \times 10^4$ or lower, for instance, $5 \times 10^4$ or lower. The Mws of the water-soluble polymer $P_{BC}$, water-soluble polymer $P_{BD}$ and water-soluble polymer $P_{BE}$ are individually typically $0.2 \times 10^4$ or higher, preferably $0.4 \times 10^4$ or higher, or more preferably $1 \times 10^4$ or higher, for instance, $3 \times 10^4$ or higher.

In the respective water-soluble polymers used as the water-soluble polymer $P_1$ or in polymer chains forming them, there are no limitations to the relationship between the weight average molecular weight (Mw) and the number average molecular weight (Mn). From the standpoint of preventing formation of aggregates, etc., for instance, a preferable kind have a molecular weight distribution (Mw/Mn) of 10.0 or below, or more preferably 7.0 or below.

As the Mw and Mn of a water-soluble polymer, the values (aqueous, based on standard polyethylene oxide) based on aqueous gel permeation chromatography (GPC) can be used.

In a water-soluble polymer $P_1$ having a polymer chain A (e.g. a PVA chain) and a polymer chain B (e.g. an N-vinyl-based polymer chain) in one same molecule or in different molecules, the polymer chain A content in the water-soluble polymer $P_1$ (the ratio of the polymer chain A in the entire water-soluble polymer $P_1$) can be, for instance, 5% by weight or higher, usually suitably 10% by weight or higher, preferably 20% by weight or higher, or more preferably 30% by weight or higher, for instance, 35% by weight or higher. The polymer chain A content in the water-soluble polymer $P_1$ is usually suitably 95% by weight or lower, preferably 80% by weight or lower, or more preferably 70% by weight or lower, for instance, 60% by weight or lower. The art disclosed herein can be preferably implemented in an embodiment where the polymer chain A content in the water-soluble polymer $P_1$ is 5% by weight or higher and 90% by weight or lower (more preferably 10% by weight or higher and 80% by weight or lower, e.g. 20% by weight or higher and 70% by weight or lower). The use of the first polishing slurry $S_1$ including such a water-soluble polymer $P_1$ can favorably bring about the effect to adequately reduce surface roughness of different types of silicon substrates varying in resistivity, respectively.

The concentration of water-soluble polymer $P_1$ in the first polishing slurry $S_1$ is not particularly limited. The concentration of water-soluble polymer $P_1$ can be, for instance, 0.0001% by weight of the first polishing slurry $S_1$ or higher, preferably 0.0005% by weight or higher, more preferably 0.001% by weight or higher, or yet more preferably 0.0015% by weight or higher. With increasing concentration of water-soluble polymer $P_1$, a higher-quality surface tends to be obtained. On the other hand, from the standpoint of the polishing removal rate, the concentration of water-soluble polymer $P_1$ is preferably 0.1% by weight of the first polishing slurry $S_1$ or lower, or more preferably 0.05% by weight or lower (e.g. 0.01% by weight or lower). In particular, from the standpoint of efficiently polishing different types of silicon substrates varying in resistivity, the concentration of water-soluble polymer $P_1$ is preferably lower than 0.01% by weight, more preferably 0.008% by weight or lower, or yet more preferably 0.005% by weight or lower.

The amount of water-soluble polymer $P_1$ per 1 g of abrasive $A_1$ contained in the first polishing slurry $S_1$ is suitably 0.0002 g or greater, preferably 0.001 g or greater, more preferably 0.002 g or greater, or yet more preferably 0.003 g or greater, for instance, 0.005 g or greater. The amount of water-soluble polymer $P_1$ per 1 g of abrasive $A_1$ contained in the first polishing slurry $S_1$ is preferably 0.05 g or less, or more preferably 0.03 g or less (e.g. 0.02 g or less).

In an embodiment where the water-soluble polymer $P_1$ includes a water-soluble polymer $P_A$ and a water-soluble polymer $P_B$, the concentration of water-soluble polymer $P_B$ in the first polishing slurry $S_1$ can be, for instance, 0.00001% by weight or higher, preferably 0.0001% by weight or higher, more preferably 0.0005% by weight or higher, or yet more preferably 0.001% by weight or higher. With increasing concentration of water-soluble polymer $P_B$, a higher-quality surface tends to be obtained. On the other hand, from the standpoint of the polishing removal rate, the concentration of water-soluble polymer $P_B$ is preferably lower than 0.1% by weight of the first polishing slurry $S_1$, or more preferably lower than 0.05% by weight (e.g. lower than 0.01% by weight). In particular, from the standpoint of efficiently polishing different types of silicon substrates varying in resistivity, the concentration of water-soluble polymer $P_B$ is preferably lower than 0.008% by weight, more preferably lower than 0.005% by weight, or even lower than 0.003% by weight.

In an embodiment where the water-soluble polymer $P_1$ includes a water-soluble polymer $P_A$ and a water-soluble polymer $P_B$, the amount of water-soluble polymer $P_B$ per 1 g of abrasive $A_1$ contained in the first polishing slurry $S_1$ is suitably 0.0001 g or greater, preferably 0.0005 g or greater, more preferably 0.001 g or greater, or yet more preferably 0.002 g or greater, for instance, 0.003 g or greater. The amount of water-soluble polymer $P_B$ per 1 g of abrasive $A_1$ contained in the first polishing slurry $S_1$ is preferably less than 0.05 g, more preferably less than 0.03 g (e.g. less than 0.02 g), or even less than 0.015 g.

(Basic Compound $B_1$)

The first polishing slurry $S_1$ preferably includes a basic compound $B_1$. As used herein, the basic compound refers to a compound that is soluble in water and capable of increasing the pH of an aqueous solution. As the basic compound $B_1$, organic or inorganic nitrogen-containing basic compounds, hydroxides of alkali metals, hydroxides of alkaline earth metals, various carbonates, hydrogen carbonates and the like can be used. Examples of nitrogen-containing basic compounds include quaternary ammonium compounds, quaternary phosphonium compounds, ammonia, and amines (preferably water-soluble amines). These basic compounds can be used solely as one kind or in a combination of two or more kinds.

Specific examples of alkali metal hydroxides include potassium hydroxide and sodium hydroxide. Specific examples of carbonates and hydrogencarbonates include ammonium hydrogencarbonate, ammonium carbonate, potassium hydrogencarbonate, potassium carbonate, sodium hydrogencarbonate, and sodium carbonate. Specific examples of amines include methylamine, dimethylamine, trimethylamine, ethylamine, diethylamine, triethylamine, ethylenediamine, monoethanolamine, N-(β-aminoethyl) ethanolamine, hexamethylenediamine, diethylenetriamine, triethylenetetraamine, anhydrous piperazine, piperazine hexahydrate, 1-(2-aminoethyl)piperazine, N-methylpiperazine, guanidine, and azoles such as imidazole and triazole. Specific examples of quaternary phosphonium compounds include quaternary phosphonium hydroxides such as tetramethylphosphonium hydroxide and tetraethylphosphonium hydroxide.

Preferable quaternary ammonium compounds include quaternary ammonium salts (typically strong salts) such as tetraalkyl ammonium salts and hydroxyalkyl trialkyl ammonium salts. Anions in such quaternary ammonium salts can be, for instance, $OH^-$, $F^-$, $Cl^-$, $Br^-$, $I^-$, $ClO_4^-$ and $BH_4^-$. A particularly preferable example is a quaternary ammonium salt whose anion is $OH^-$, that is, a quaternary ammonium hydroxide. Specific examples of quaternary ammonium hydroxides include tetramethylammonium hydroxide, tetraethylammonium hydroxide, tetrapropylammonium hydroxide, tetrabutylammonium hydroxide, tetrapentylammonium hydroxide and tetrahexylammonium hydroxide; and hydroxyalkyltrialkylammonium hydroxides such as 2-hydroxyethyltrimethylammonium hydroxide (or choline). Among these, tetraalkylammonium hydroxides are preferable. In particular, tetramethylammonium hydroxide (TMAH) is preferable.

As the basic compound $B_1$ in the first polishing slurry $S_1$, at least one kind of basic compound selected among alkali metal hydroxides, quaternary ammonium hydroxides and ammonia is preferable. Among these, alkali metal hydroxides and quaternary ammonium hydroxides are more preferable, and alkali metal hydroxides are particularly preferable. The art disclosed herein can be preferably implemented in an embodiment where the first polishing slurry $S_1$ comprises a water-soluble polymer $P_1$ having a PVA chain and an N-vinyl-based polymer chain (e.g. a PVP chain) in one same molecule or in different molecules, and at least one kind of basic compound $B_1$ selected among alkali metal hydroxides and quaternary ammonium hydroxides (more preferably alkali metal hydroxides, e.g. potassium hydroxide).

(Surfactant)

The first polishing slurry $S_1$ may comprise surfactant (typically a water-soluble organic compound with Mw less than $1 \times 10^4$). The surfactant may contribute to enhance dispersion stability of the first polishing slurry $S_1$ or a concentrate thereof. As the surfactant, anionic or nonionic type can be preferably used. From the standpoint of the low-foaming properties and easy pH adjustment, nonionic surfactants are more preferable. Examples of nonionic surfactant include oxyalkylene polymers such as polyethylene glycol, polypropylene glycol, polytetramethylene glycol, etc.; polyoxyalkylene adducts such as polyoxyethylene alkyl ether, polyoxyethylene alkyl phenyl ether, polyoxyethylene alkylamine, polyoxyethylene fatty acid esters, polyoxyethylene glyceryl ether fatty acid esters, polyoxyethylene sorbitan fatty acid esters, etc.; copolymers (e.g. diblock copolymers, triblock copolymers, random copolymers, alternating copolymers) of several kinds of oxyalkylene. For the surfactant, solely one kind or a combination of two or more kinds can be used.

The surfactant's Mw is typically less than $1 \times 10^4$. From the standpoint of the filterability of the polishing slurry and the cleanability of the polished object, etc., it is preferably 9500 or lower (e.g. lower than 1000). The surfactant's Mw is typically 200 or higher. From the standpoint of decreasing the level of haze, etc., it is preferably 250 or higher, or more preferably 300 or higher (e.g. 500 or higher). As the surfactant's Mw, the value determined by GPC (aqueous, based on standard polyethylene glycol) or the value determined from the chemical formula can be used. The art disclosed herein can be practiced in an embodiment where the first polishing slurry $S_1$ is substantially free of a surfactant as described above.

(Chelating Agent)

The first polishing slurry $S_1$ may include a chelating agent. The chelating agent forms a complex ion with a metal impurity in polishing slurry to trap this, thereby reducing contamination of the polishing object with the metal impurity. Examples of chelating agent include aminocarboxylic acid-based chelating agents and organophosphonic acid-based chelating agents. Examples of aminocarboxylic acid-based chelating agents include ethylenediamine tetraacetic acid, ethylenediamine tetraacetic acid sodium salt, nitrilotriacetic acid, nitrilotriacetic acid sodium salt, nitrilotriacetic acid ammonium salt, hydroxyethylethylenedimaine triacetic acid, hydroxyethylethylenediamine triacetic acid sodium salt, diethylenetriamine pentaacetic acid, diethylenetriamine pentaacetic acid sodium salt, triethylenetetramine hexaacetic acid, and triethylenetetramine hexaacetic acid sodium salt. Examples of organophosphonic acid-based chelating agents include 2-aminoethylphosphonic acid, 1-hydroxyethylidene-1,1-diphosphonic acid, aminotri (methylenephosphonic acid), ethylenediaminetetrakis(methylenephosphonic acid), diethylenetriaminepenta(methylenephosphonic acid), ethane-1,1-diphosphonic acid, ethane-1,1,2-triphosphonic acid, ethane-1-hydroxy-1,1-diphosphonic acid, ethane-1-hydroxy-1,1,2-triphosphonic acid, ethane-1,2-dicarboxy-1,2-diphosphonic acid, methanehydroxyphosphonic acid, 2-phosphonobutane-1,2-dicarboxylic acid, 1-phosphonobutane-2,3,4-tricarboxylic acid, and α-methylphosphonosuccinic acid. Among them, organophosphonic acid-based chelating agents are preferable. More preferable examples include ethylenediaminetetrakis(methylenephosphonic acid) and diethylenetriaminepenta(methylenephosphonic acid) and diethylenetriaminepentaacetic acid. Particularly preferable chelating agents include ethylene diaminetetrakis(methylenephosphonic acid) and diethylene triamine penta(methylene phosphonic acid). For the chelating agent, solely one kind or a combination of two or more kinds can be used.

The art disclosed herein can be implemented in an embodiment using the first polishing slurry $S_1$ substantially free of a chelating agent.

(Other Components)

As long as the effect of the present invention is not impaired, the first polishing slurry $S_1$ may further include, as necessary, other known additives that can be used in polishing slurries (typically those used in polishing steps of silicon substrates), such as an organic acid, organic acid salt, inorganic acid, inorganic acid salt, antiseptic agent, and anti-fungal agent.

The first polishing slurry $S_1$ is preferably substantially free of oxidant. This is because when the first polishing slurry $S_1$ containing an oxidant is supplied to a polishing object (a silicon substrate here), the surface of the polishing object may be oxidized to form an oxide layer, leading to degraded polishing removal rate. Specific examples of the oxidant include hydrogen peroxide ($H_2O_2$), sodium persulfate, ammonium persulfate and sodium dichloroisocyanurate. The first polishing slurry $S_1$ being substantially free of oxidant means that no oxidant has been intentionally allowed to be included.

(pH)

The first polishing slurry $S_1$ has a pH of typically 8.0 or higher, preferably 8.5 or higher, more preferably 9.0 or higher, or yet more preferably 9.5 or higher, for instance, 10.0 or higher. With increasing pH of the first polishing slurry $S_1$, the polishing removal rate tends to be enhanced. On the other hand, from the standpoint of preventing dissolution of the abrasive (e.g. silica particles) and reducing weakening of mechanical polishing effect of the abrasive, the pH of the first polishing slurry $S_1$ is suitably 12.0 or lower, preferably 11.8 or lower, more preferably 11.5 or lower, or yet more preferably 11.0 or lower. A similar pH value can be preferably used in the second polishing slurry $S_2$ described later.

In the art disclosed herein, the pH of a liquid composition (possibly polishing slurry, a concentrate thereof, a rinse solution described later) can be obtained as follows: Using a pH meter and standard buffer solutions (a phthalate pH buffer solution at pH 4.01 (25° C.), a neutral phosphate pH buffer solution at pH 6.86 (25° C.), and a carbonate pH buffer solution at pH 10.01 (25° C.)), after three-point correction, a glass electrode is immersed in the polishing liquid; and the stabilized value after two minutes or more is measured. As the pH meter, a glass electrode proton concentration meter (model number F-23) available from Horiba, Ltd., or a comparable product is used.

<Second Polishing Slurry $S_2$>

The second polishing slurry $S_2$ includes an abrasive $A_2$ and typically further includes water and preferably a water-soluble polymer $P_2$ as well. As the water, the same kinds as the first polishing slurry $S_1$ can be preferably used.

(Abrasive $A_2$)

The abrasive $A_2$ for use in the second polishing slurry $S_2$ can be selected from the examples given as the abrasive that can be used in the first polishing slurry $S_1$. For the abrasive $A_2$, solely one kind or a combination of two or more kinds can be used. The abrasive $A_1$ and the abrasive $A_2$ can be the same abrasive or different abrasives varying in at least one feature, such as the material, size (e.g. BET diameter), shape, and so forth.

As the abrasive $A_2$, inorganic particles are preferable. In particular, particles formed of oxides of metals and metalloids are preferable. Silica particles are particularly preferable. The art disclosed herein can be preferably practiced in an embodiment where the abrasive $A_2$ in the second polishing slurry $S_2$ is substantially formed of silica particles. Here, the term "substantially" indicates that the silica particles account for 95% by weight or more (preferably 98% by weight or more, more preferably 99% by weight or more, or even 100% by weight) of particles forming the abrasive $A_2$. The art disclosed herein can be preferably practiced in an embodiment where both the abrasive $A_1$ and the abrasive $A_2$ are silica particles. For instance, the same silica particles can be used as the abrasive $A_1$ and the abrasive $A_2$.

In an preferable embodiment, the BET diameter of the abrasive $A_2$ is preferably in a range between 10 nm below and 10 nm above the BET diameter of the abrasive $A_1$, more preferably 10 nm below and 5 nm above it, or yet more preferably 5 nm below and 5 nm above it. When the BET diameter of the abrasive $A_1$ and the BET diameter of the abrasive $A_2$ satisfy this relationship, switching from the first polishing slurry $S_1$ to the second polishing slurry $S_2$ tends to proceed more smoothly. The art disclosed herein can be preferably implemented in an embodiment where the BET of the abrasive $A_1$ is in a range between 2 nm below and 2 nm above the BET diameter of the abrasive $A_2$. For instance, the same abrasive can be used as the abrasive $A_1$ and the abrasive $A_2$.

The art disclosed herein can be practiced in an embodiment where the BET diameters of both the abrasive $A_1$ and the abrasive $A_2$ are preferably 20 nm or greater and less than 60 nm, more preferably 25 nm or greater and 55 nm or less, or more preferably 30 nm or greater and 45 nm or less, for instance, greater than 30 nm and 40 nm or less. By this, high-quality surfaces can be efficiently obtained with respect to different silicon substrates varying in resistivity. When the polishing method disclosed herein is applied to final polishing of a silicon substrate, it is particularly effective to use abrasives $A_1$ and $A_2$ with these BET diameters.

The content of the abrasive $A_2$ in the second polishing slurry $S_2$ is not particularly limited. In an embodiment, the content of $A_2$ is preferably 0.01% by weight or higher, more preferably 0.5% by weight or higher, or yet more preferably 0.1% by weight or higher, for instance, 0.2% by weight or higher. With increasing the content of the abrasive $A_2$, higher polishing removal rate can be achieved. From the standpoint of the ease of its removal from the polishing object, etc., the content of $A_2$ is usually suitably 5% by weight or lower, preferably 3% by weight or lower, more preferably 2% by weight or lower, or yet more preferably 1% by weight or lower, for instance, 0.5% by weight or lower.

In a preferable embodiment, the content of the abrasive $A_2$ in the second polishing slurry $S_2$ can be 75% up to 125% of the content of the abrasive $A_1$ (percentage by weight) in the first polishing slurry $S_1$, preferably 80% up to 110%, more preferably 90% up to 105%. By this, switching from the first polishing slurry $S_1$ to the second polishing slurry $S_2$ tends to proceed more smoothly. The polishing method disclosed herein can be preferably practiced in an embodiment where the content of the abrasive $A_1$ in the first polishing slurry $S_1$ is approximately equal to the content of the abrasive $A_2$ in the second polishing slurry $S_2$, for instance, in an embodiment where the content of the abrasive $A_2$ in the second polishing slurry $S_2$ is in a range between 3% below and 3% above the content of the abrasive $A_1$ in the first polishing slurry $S_1$.

(Water-Soluble Polymer $P_2$)

The second polishing slurry $S_2$ preferably includes a water-soluble polymer $P_2$. The water-soluble polymer $P_2$ used is not particularly limited. For instance, solely one kind or a suitable combination of two or more kinds can be used among the examples of water-soluble polymer $P_A$ and water-soluble polymer $P_B$ that can be used as the water-soluble polymer $P_1$ in the first polishing slurry $S_1$. In an embodiment, the water-soluble polymer $P_2$ can be the same kind of polymer as the polymer(s) included in the water-soluble polymer $P_1$ or the same kind of polymer as the polymer(s) included in the water-soluble polymer $P_1$, yet with a different Mw (e.g. with a higher Mw).

Favorable examples of the water-soluble polymer $P_2$ include a cellulose derivative (polymer $P_{BA}$). For instance, HEC can be preferably used. The art disclosed herein can be preferably implemented in an embodiment where HEC is used solely as the water-soluble polymer $P_2$. The art disclosed herein can be practiced in an embodiment where the water-soluble polymer $P_2$ includes HEC in combination with other water-soluble polymer. In such an embodiment, the ratio of HEC in the entire water-soluble polymer $P_2$ can be, for instance, 30% by weight or higher, more preferably 50% by weight or higher, or yet more preferably 80% by weight or higher.

In an embodiment, the Mw of the water-soluble polymer $P_2$ is preferably higher than the Mw of the water-soluble polymer $P_1$. The Mw of the water-soluble polymer $P_2$ can be, for instance, at least 1.5 times the Mw of the water-soluble polymer $P_1$, preferably at least 2 times the $P_1$'s Mw, for instance, at least 3 times the $P_1$'s Mw. By this, higher-quality surfaces can be efficiently obtained with respect to different silicon substrates varying in resistivity. Here, when one or each of the water-soluble polymer $P_1$ and the water-soluble polymer $P_2$ includes different kinds of water-soluble polymers varying in Mw, the Mw is compared between water-soluble polymers with the highest Mws among the water-soluble polymers in the respective water-soluble polymers $P_1$ and $P_2$.

The concentration of water-soluble polymer $P_2$ in the second polishing slurry $S_2$ is not particularly limited. The concentration of water-soluble polymer $P_2$ can be, for instance, 0.0005% by weight of the second polishing slurry $S_2$ or higher, preferably 0.001% by weight or higher, or more preferably 0.002% by weight or higher, for instance, 0.005% by weight or higher. With increasing concentration of water-soluble polymer $P_2$, a higher-quality surface tends to be obtained. On the other hand, from the standpoint of the polishing removal rate, the concentration of water-soluble polymer $P_2$ is preferably 0.5% by weight of the second polishing slurry $S_2$ or lower, more preferably 0.2% by weight or lower, or more preferably 0.1% by weight or lower (e.g. 0.05% by weight or lower). From the standpoint of efficiently polishing different silicon substrates varying in resistivity, the concentration of water-soluble polymer $P_2$ is lower than 0.05% by weight, preferably 0.02% by weight or lower, or more preferably 0.015% by weight or lower.

The amount of water-soluble polymer $P_2$ per 1 g of abrasive $A_2$ contained in the second polishing slurry $S_2$ is suitably 0.0005 g or greater, preferably 0.002 g or greater, or more preferably 0.005 g or greater. The amount of water-soluble polymer $P_2$ per 1 g of abrasive $A_2$ contained in the second polishing slurry $S_2$ is preferably 0.5 g or less, more preferably 0.3 g or less, or yet more preferably 0.1 g or less.

In an embodiment, the concentration of water-soluble polymer $P_2$ in the second polishing slurry $S_2$ is preferably higher than the concentration $C_1$ of water-soluble polymer $P_1$ in the first polishing slurry $S_1$, for instance, by a factor of 1.2 or greater (preferably by a factor of 1.5 or greater, more preferably by a factor of 2 or greater). The amount of water-soluble polymer $P_2$ per 1 g of abrasive $A_2$ contained in the second polishing slurry $S_2$ is preferably greater than the amount of water-soluble polymer $P_1$ per 1 g of abrasive $A_1$ contained in the first polishing slurry $S_1$, for instance, by a factor of 1.2 or greater (preferably by a factor of 1.5 or greater, more preferably by a factor of 2 or greater). When one or each of the concentration and the amount contained is satisfied, higher-quality surfaces can be efficiently obtained with respect to different silicon substrates varying in resistivity.

(Basic Compound $B_2$)

The second polishing slurry $S_2$ includes a basic compound $B_2$. The basic compound $B_2$ used is not particularly limited. For instance, solely one kind or a suitable combination of two or more kinds can be used among the examples of the basic compound $B_1$ that can be used in the first polishing slurry $S_1$. The basic compound $B_2$ can be the same compound as or a different compound from the basic compound $B_1$.

As the basic compound $B_2$, at least one kind of basic compound selected among alkali metal hydroxides, quaternary ammonium hydroxides and ammonia is preferable. Among these, quaternary ammonium hydroxides and ammonia are more preferable, and ammonia is particularly preferable. The art disclosed herein can be preferably implemented in an embodiment where the second polishing slurry $S_2$ comprises a water-soluble polymer $P_2$ that includes a cellulose derivative (e.g. HEC) and further comprises a basic compound $B_2$ that includes ammonia.

The second polishing slurry $S_2$ may include a surfactant. As the surfactant, the same kinds as the first polishing slurry $S_1$ can be used. The art disclosed herein can be practiced in an embodiment where the second polishing slurry $S_2$ is substantially free of a surfactant.

The second polishing slurry $S_2$ may include a chelating agent. As the chelating agent, the same kinds as the first polishing slurry $S_1$ can be used. The art disclosed herein can be practiced in an embodiment where the second polishing slurry $S_2$ is substantially free of a chelating agent.

(Other Components)

As far as the effect of the present invention is not significantly impaired, the second polishing slurry $S_2$ may further include, as necessary, other known additives such as an organic acid, organic acid salt, inorganic acid, inorganic acid salt, antiseptic agent and antifungal agent, which can be used in polishing slurries (typically, polishing slurries used in steps of polishing silicon substrates). Similarly to the first polishing slurry $S_1$, the second polishing slurry $S_2$ is preferably substantially free of an oxidant.

<Polishing Removal Rate>

The first polishing slurry $S_1$ preferably shows at least comparable polishing removal rate to the second polishing slurry $S_2$, or more preferably shows higher polishing removal rate than the second polishing slurry $S_2$. By this, higher-quality surfaces can be efficiently obtained with respect to different silicon substrates varying in resistivity. Here, that the first polishing slurry $S_1$ shows higher polishing removal rate than the second polishing slurry $S_2$ means that when identical polishing objects are polished under the same polishing conditions, the polishing removal using the first polishing slurry $S_1$ as the polishing slurry is greater than the polishing removal using the second polishing slurry $S_2$ as the polishing slurry. That the first polishing slurry $S_1$ shows higher polishing removal rate than the second polishing slurry $S_2$ can be confirmed by determining and comparing polishing removal rate of the respective polishing slurries by the method described later in Examples. The silicon substrate used for comparison of polishing removal rate is not particularly limited. For instance, it can be any silicon substrate among P−, P++, and P+++ in the working examples described later. P− substrates are preferably used as they show significant differences in polishing removal rate and relative polishing removal rate is readily assessed.

The polishing removal rate of each polishing slurry can be controlled through, for instance, the material, BET diameter and concentration of the abrasive; the type and concentration of water-soluble polymer; the type of basic compound; the pH of the polishing slurry; and so on. An ordinarily-skilled person in the field can suitably adjust the polishing removal rate of the first polishing slurry $S_1$ and the second polishing slurry $S_2$ or their relationship based on common technical knowledge and the disclosures of the present description including specific working examples described later.

<Polishing>

In the polishing method disclosed herein, the first polishing slurry $S_1$ and the second polishing slurry $S_2$ are supplied to a silicon substrate to be polished, with the two polishing slurries switched in this order midway through polishing the silicon substrate. For instance, the polishing method can be carried out in an embodiment including the following procedures.

In particular, a silicon substrate as a polishing object is set in a polishing machine and the first-sub-step polishing is carried out by supplying the first polishing slurry $S_1$ to the surface (surface to be polished) of the polishing object through a polishing pad fixed to a platen (or a polishing platen) in the polishing machine Typically, while continuously supplying the polishing slurry, the polishing pad is pushed against the surface of the polishing object and the two are allowed to move in coordination (e.g. in circular motion). At time $T_1$ after the start of polishing with the first polishing slurry $S_1$, the polishing slurry being supplied to the polishing object is switched to the second polishing slurry $S_2$; and the second-sub-step polishing with the second polishing slurry $S_2$ is performed on the polishing object for a time $T_2$.

The relationship between the polishing time $T_1$ of the first sub-step and the polishing time $T_2$ of the second sub-step is not particularly limited. In an embodiment, the polishing time $T_1$ of the first sub-step can be longer than the polishing time $T_2$ of the second sub-step. In other words, the polishing method disclosed herein can be practiced in an embodiment where the time $T_2$ for polishing a silicon substrate to be polished while supplying the second polishing slurry $S_2$ is shorter than the time $T_1$ for polishing the silicon substrate while supplying the first polishing slurry $S_1$. Like this, by relatively extending the time for polishing with the first polishing slurry $S_1$ which shows higher polishing removal rate, higher-quality surfaces can be efficiently obtained with respect to different silicon substrates varying in resistivity. For instance, the polishing method disclosed herein can be preferably practiced in an embodiment where the first-sub-step polishing time $T_1$ is at least 1.2 times (more preferably at least 1.5 times, e.g. at least 2 times) the second-sub-step polishing time $T_2$.

While no particular limitations are imposed, the total polishing time $(T_1+T_2)$ of the first and second sub-steps can be, for instance, 60 minutes or less. From the standpoint of the productivity, it is preferably 40 minutes or less, or more preferably 20 minutes or less. On the other hand, from the standpoint of obtaining a high-quality surface, the total polishing time is usually 3 minutes or more, or preferably 5 minutes or more; it can be, for instance, 7 minutes or more.

Each polishing slurry can be in a concentrate form before supplied to the polishing object, that is, a concentrated liquid form of the polishing slurry. The concentrated liquid can be thought as a stock solution of the polishing slurry. The polishing slurry in a concentrated form is advantageous from the standpoint of cost reduction and the convenience during its production, distribution, storage, etc. The concentration factor is not particularly limited. For instance, it can be about 2× to 100× by volume; it is usually suitably about 5× to 50× (e.g. about 10× to 40×).

Such a concentrate can be used in an embodiment where it is diluted whenever desired to prepare a polishing slurry (working slurry) and the resulting polishing slurry is supplied to a polishing object. It can be diluted by, for instance, adding water to the concentrate and mixing them.

The content of the abrasive of the concentrate can be, for instance, 50% by weight or lower. From the standpoint of the ease of handling the concentrate (e.g. the abrasive's dispersion stability and the filterablity), etc., the content of the abrasive of the concentrate is usually preferably 45% by weight or lower, or more preferably 40% by weight or lower. From the standpoint of cost reduction and the convenience during its production, distribution, storage and so on, the content of the abrasive can be, for instance, 0.5% by weight or higher, preferably 1% by weight or higher, or more preferably 3% by weight or higher, for instance, 4% by weight or higher. In a preferable embodiment, the abrasive content can be 5% by weight or higher, 10% by weight or higher, 15% by weight or higher, 20% by weight or higher, or even 30% by weight or higher.

The polishing slurry in the art disclosed herein or a concentrate thereof used may be a single-agent type or a multi-agent type such as a two-agent type. For example, it may be formulated so that part A comprising at least the abrasive among the components of the polishing slurry is mixed with part B comprising the remaining components and the mixture is diluted as necessary when desired to prepare the polishing slurry.

The method for preparing the polishing slurry or its concentrate is not particularly limited. For instance, the respective components of the polishing slurry or its concentrate can be mixed, using a known mixer such as a blade type stirrer, ultrasonic disperser and homomixer. The way of mixing these components is not particularly limited. For instance, all the components can be mixed at once or in a suitably selected order.

In each polishing sub-step, the polishing slurry can be used in an embodiment where it is disposed when used once in polishing (one-way) or it is used in recycle. One example of the method where the polishing slurry is circulated for use is a method where a tank collects a used portion of the polishing slurry released from a polishing machine and supplies the collected polishing slurry back to the polishing machine. The polishing method disclosed herein can be preferably practiced in an embodiment where both the first polishing slurry $S_1$ and the second polishing slurry $S_2$ are used as one-way in the first and second sub-steps, respectively.

The polishing pad(s) used in the polishing method disclosed herein are not particularly limited. For instance, any of the polyurethane foam type, non-woven fabric type, and suede type can be used. Each polishing pad may comprise abrasive particles or may be free of abrasive particles. In typical, an abrasive-free polishing pad is preferably used.

The polishing method disclosed herein can be applied to a stock polishing step and a final polishing step for a silicon substrate (e.g. a monocrystalline silicon wafer). In particular, it can be preferably applied to final polishing of a silicon substrate after lapping and stock polishing (i.e. a lapped and stock-polished silicon substrate). The silicon substrate at the start of the first sub-step may have a surface roughness (arithmetic surface roughness (Ra)) of, for instance, about 0.01 nm to 100 nm. The polishing method disclosed herein can be preferably applied to polishing (typically final polishing) of a silicon substrate that has been prepared in an earlier step to have surface conditions with surface roughness Ra of about 0.01 nm to 100 nm. The surface roughness Ra of the silicon substrate can be determined, using, for instance, a laser-scanning surface roughness meter TMS-3000WRC available from Schmitt Measurement System Inc.

The polishing machine used in the polishing method disclosed herein is constituted so that by switching polishing slurries supplied to the same platen during polishing, the first sub-step and the second sub-step can be carried out on the same platen. The polishing machine can be a double-sided polishing machine which polishes both faces of a polishing object at the same time or a single-sided polishing machine which polishes only one face of a polishing object. While no particular limitations are imposed, when the polishing method disclosed herein is applied to final polishing, as the polishing machine for performing the first and second sub-steps, a single-sided polishing machine can be preferably used. When stock polishing is performed before the first sub-step, the stock polishing can be carried out using a double-sided polishing machine or a single-sided polishing machine. For instance, it can be preferably carried out, using a double-sided polishing machine Each polishing machine can be equipped with one, two or more platens. Each polishing machine can be a single wafer polishing machine which is configured so as to polish a sheet of a polishing object at once, or a batch-type polishing machine which allows simultaneous polishing of several polishing objects on one same platen.

After the second sub-step of polishing the polishing object, the polishing method disclosed herein may include a sub-step where a rinse solution is supplied to the polishing object to rinse it on the same platen as the second-sub-step polishing. As the rinse solution, an aqueous solvent (e.g. water) can be used. It is also possible to use a rinse solution that includes, in an aqueous solvent, an arbitrary component among components that can be used in the second polishing slurry $S_2$, excluding abrasives.

The polishing object after the second-sub-step polishing is typically cleaned. The cleaning can be carried out, using a suitable cleaning solution. The cleaning solution used is not particularly limited. Usable examples include SC-1 cleaning solution (a mixture of ammonium hydroxide ($NH_4OH$), hydrogen peroxide ($H_2O_2$) and water ($H_2O$), SC-2 cleaning solution (a mixture of HCl, $H_2O_2$ and $H_2O$) and the like that are generally used in the field of semiconductors. The temperature of the cleaning solution can be, for instance, in a range between room temperature (typically about 15° C. to 25° C.) and about 90° C. From the standpoint of making the cleaning more effective, a cleaning solution at about 50° C. to 85° C. can be preferably used. The cleaning is typically carried out off the polishing machine(s) used in the first-sub-step and second-sub-step polishing, that is, after the polishing object is removed from the polishing machine(s).

<Polishing Object>

The polishing method disclosed herein can be commonly applied to polishing different types of silicon substrates (typically monocrystalline silicon wafers) varying in resistivity. Here, the phrase "commonly applied" means that the different types of silicon substrates are subjected to the first sub-step of polishing with first polishing slurries $S_1$ having the same composition and to the second sub-step of polishing with second polishing slurries $S_2$ having the same composition, with the two sub-steps carried out in this order. By this, for instance, using a polishing machine constituted to allow switching the supply between the first polishing slurry $S_1$ and the second polishing slurry $S_2$, different types of silicon substrates varying in resistivity can be set for polishing in the polishing machine in an arbitrary order and whenever appropriate.

In an embodiment of the polishing method disclosed herein, with respect to the first-sub-step polishing time $T_1$ and the second-sub-step polishing time $T_2$, the same $T_1$ and the same $T_2$ can be commonly applied to different types of silicon substrates varying in resistivity (different types of silicon substrates varying in resistivity can be polished in the same $T_1$ and in the same $T_2$). According to such an embodiment, for instance, when a batch-type polishing machine is used, silicon substrate varying in resistivity can be polished simultaneously on the same platen. Regardless of the type of silicon substrate to be polished (e.g. regardless of the resistivity of the silicon substrate), the same total polishing time can be applied and thus the polishing machine can be efficiently used.

The polishing method disclosed herein can be commonly applied to polishing different types of silicon substrates with resistivity varying by a factor of, for instance, 10 or greater. It is particularly effective to apply the method to polishing different types of silicon substrates with resistivity varying by a factor of 20 or greater (preferably by a factor of 100 or greater, more preferably by a factor of 150 or greater, e.g. by a factor of 200 or greater).

In a preferable embodiment, the different types of silicon substrates may include a silicon substrate having a resistivity of 1 Ω·cm or greater and a silicon substrate having a resistivity less than 0.005 Ω·cm. The polishing method disclosed herein can be preferably applied to polishing (e.g. final polishing) of these silicon substrates. For instance, it can be commonly applied to a silicon substrate having a resistivity of 0.1 Ω·cm or greater, for instance, 1 Ω·cm or greater as well as to a silicon substrate having a resistivity less than 0.05 Ω·cm, for instance, less than 0.005 Ω·cm. It is particularly preferably applied to final polishing of these silicon substrates. The polishing method disclosed herein can be commonly applied to such silicon substrates with varied resistivity to efficiently provide high-quality finishes to the surfaces of these silicon substrates.

<Polishing Composition Set>

The present application provides a polishing composition set that can be preferably used in the polishing method disclosed herein. The polishing composition set comprises at least a first composition $Q_1$ and a second composition $Q_2$ that are separately stored. The composition $Q_1$ can be the first polishing slurry $S_1$ used in the first sub-step or a concentrate thereof. The composition $Q_2$ can be the second polishing slurry $S_2$ used in the second sub-step or a concentrate thereof. The polishing method disclosed herein can be favorably practiced using such a polishing composition set. Thus, the polishing composition set can be preferably used in the polishing method disclosed herein or in a method that includes this polishing method for producing a polished product. Each polishing composition forming the polishing composition set can be a single-pack type, or a multi-pack type such as a two-pack type. The multi-pack polishing composition can be configured so that, for instance, part A comprising at least the abrasive among the components of each polishing composition and part B comprising the remaining components are stored separately, part A and part B are mixed as necessary when desired, and the mixture is diluted to prepare a polishing composition or polishing slurry.

As understood from the description above and Examples shown below, matters disclosed by this description include the following:

(1) A method for polishing a silicon wafer, the method comprising polishing (preferably final polishing) a silicon wafer having a resistivity less than 0.005 Ω·cm, using a first polishing slurry $S_1$ disclosed herein.

(2) A method for polishing a silicon wafer, the method comprising commonly using a first polishing slurry $S_1$ disclosed herein for polishing (preferably final polishing) a silicon wafer having a resistivity less than 0.005 Ω·cm and for polishing (preferably final polishing) a silicon wafer having a resistivity of 1 Ω·cm or greater.

(3) The silicon wafer polishing method according to (1) or (2) above, the method comprising, subsequently to the polishing with the first polishing slurry $S_1$, polishing (preferably final polishing) the silicon wafer using a second polishing slurry $S_2$ disclosed herein on one same platen.

(4) A method for producing a polished silicon wafer (polished wafer), the method comprising the polishing method according to any of (1) to (3) above.

(5) A polishing composition that is a first polishing slurry $S_1$ disclosed herein or a concentrate thereof and is used for polishing (preferably final polishing) a silicon wafer having a resistivity less than 0.005 Ω·cm.

(6) A polishing composition that is a first polishing slurry $S_1$ disclosed herein or a concentrate thereof, and is commonly used in polishing (preferably final polishing) a silicon wafer having a resistivity less than 0.005 Ω·cm and in polishing (preferably final polishing) a silicon wafer having a resistivity of 1 Ω·cm or greater.

(7) A polishing composition that is a second polishing slurry $S_2$ disclosed herein or a concentrate thereof is used, subsequently to polishing a silicon wafer with the polishing composition according to (5) or (6) above or a first polishing slurry $S_1$ prepared using the polishing composition, in polishing the silicon wafer on one same platen.

EXAMPLES

Several working examples relating to the present invention are described below although the present invention is not to be limited to such working examples.

1. Preparation of Polishing Slurries (Slurry A)

Was prepared Slurry A having the composition shown in Table 1, containing, in ion-exchanged water, colloidal silica (35 nm BET diameter) as the abrasive, hydroxyethyl cellulose (HEC, Mw 140×10$^4$) as the water-soluble polymer and ammonia as the basic compound.

(Slurry B)

Was prepared Slurry B having the composition shown in Table 1, containing, in ion-exchanged water, colloidal silica (35 nm BET diameter), HEC (Mw 120×10$^4$) and tetramethylammonium hydroxide (TMAH).

(Slurries C to E, J, K)

Were prepared Slurries C to E, J and K having the compositions shown in Table 1, containing colloidal silica (35 nm BET diameter), PVA, PVP and KOH in ion-exchanged water. The Mws of PVA and PVP used in preparing the respective slurries are as shown in Table 1. Degrees of saponification of PVA used in preparing these slurries were all 98% by mole or higher. The PVP used in preparing these slurries was vinylpyrrolidone homopolymer. In Table 1, C10PEO5 represents polyoxyethylene decyl ether wherein the average number of moles of ethylene oxide added is 5.

(Slurries F to H)

Were prepared Slurries F to H having the compositions shown in Table 1, containing colloidal silica (35 nm BET diameter), PVA main chain/PVP graft copolymer and KOH in ion-exchanged water. The Mws of main chains and side chains of PVA main chain/PVP graft copolymers used in preparing the respective slurries are as shown in Table 1. With respect to these graft copolymer, degrees of saponification of PVA forming their main chains are all 98% by mole or higher and the PVP forming their side chains is vinylpyrrolidone homopolymer.

(Slurry I)

Was prepared Slurry I having a composition shown in Table 1, containing colloidal silica (35 nm BET diameter), HEC (Mw 140×10$^4$) and KOH in ion-exchanged water.

The BET diameter of the colloidal silica was determined, using a specific surface area analyzer under trade name Flow Sorb II 2300 available from Micromeritics. Slurries A to I were prepared to have pH in the range between 10 and 11.

TABLE 1

| Slurry | Water-soluble polymer Type | Mw (×10$^4$) | Concentration (by weight) | Abrasive Amount contained (by weight) | Basic compound Type | Concentration (by weight) | Surfactant Type | Concentration (by weight) |
|---|---|---|---|---|---|---|---|---|
| A | HEC | 140 | 0.0090% | 0.225% | NH$_3$ | 0.008% | — | — |
| B | HEC | 120 | 0.0002% | 0.570% | TMAH | 0.075% | — | — |
| C | PVA | 7.5 | 0.00125% | 0.225% | KOH | 0.011% | — | — |
|   | PVP | 4.5 | 0.00125% |   |   |   |   |   |
| D | PVA | 7.5 | 0.00125% | 0.225% | KOH | 0.011% | — | — |
|   | PVP | 25 | 0.00125% |   |   |   |   |   |
| E | PVA | 10.56 | 0.00125% | 0.225% | KOH | 0.011% | — | — |
|   | PVP | 4.5 | 0.00125% |   |   |   |   |   |
| F | PVA main chain-PVP graft copolymer | main chain 7.5 side chain 8.0 | 0.00250% | 0.225% | KOH | 0.011% | — | — |
| G | PVA main chain-PVP graft copolymer | main chain 2.2 side chain 3.7 | 0.00250% | 0.225% | KOH | 0.011% | — | — |

TABLE 1-continued

| Slurry | Water-soluble polymer | | | Abrasive Amount contained (by weight) | Basic compound | | Surfactant | |
|---|---|---|---|---|---|---|---|---|
| | Type | Mw ($\times 10^4$) | Concentration (by weight) | | Type | Concentration (by weight) | Type | Concentration (by weight) |
| H | PVA main chain-PVP graft copolymer | main chain 1.32 side chain 1.5 | 0.00250% | 0.225% | KOH | 0.011% | — | — |
| I | HEC | 140 | 0.00250% | 0.225% | KOH | 0.011% | — | — |
| J | PVA | 10.56 | 0.00250% | 0.225% | KOH | 0.011% | — | — |
| | PVP | 4.5 | 0.00125% | | | | | |
| K | PVA | 10.56 | 0.00250% | 0.225% | KOH | 0.011% | C10PEO5 | 0.000075% |
| | PVP | 4.5 | 0.00125% | | | | | |

2. Polishing Silicon Wafers

Polishing tests were conducted, using the following three types of silicon substrates (300 mm diameter, monocrystalline silicon wafers).

P−: 1 Ω·cm ≤ Resistivity <100 Ω·cm
P++: 0.006 Ω·cm ≤ Resistivity <0.010 Ω·cm
P+++: Resistivity <0.002 Ω·cm <Stock Polishing Step>

Was prepared a stock polishing slurry (working slurry) containing 0.7% colloidal silica (35 nm BET diameter), 0.04% TMAH and 0.25% piperazine by weight in ion-exchanged water. Using the stock polishing slurry, silicon substrates to be polished were stock-polished under the conditions shown below to adjust the surfaces of the respective silicon substrates (P−, P++, P+++) to surface roughness Ra of about 0.4 nm.

[Stock Polishing Conditions]

Polishing machine: single-sided polishing machine, model number SPM-15, available from Fujikoshi Machinery Corp.
Polishing pressure: 320 g/cm²
Platen rotational speed: 30 rpm
Head rotational speed: 30 rpm
Polishing pad: product name SUBA600, non-woven fabric, available from Nitta Haas Inc.
Supply flow rate: 6 L/min (recycle)
Temperature maintained in polishing environment: 23° C.

(Cleaning)

Polished silicon wafers were removed from the polishing machine and cleaned (SC-1 cleaning) with a cleaning solution at NH₄OH (29%)/H₂O₂ (31%)/deionized water (DIW) =1/1/15 (volume ratio). More specifically, two cleaning baths each attached with an ultrasonic wave oscillator of 950 kHz frequency were obtained; the cleaning solution was placed in each of the first and second cleaning baths and maintained at 80° C.; and stock-polished silicon substrates were dipped in the first cleaning bath for 5 minutes and then, via a ultrasonic rinsing bath with ultrapure water, in the second cleaning bath for 5 minutes, with the respective ultrasonic wave oscillators turned on.

<Final Polishing Step>

Using Slurries A to K as they were as polishing slurries (working slurries), the cleaned silicon substrates were subjected to final polishing under the conditions shown below.

[Final Polishing Conditions]

Polishing objects: as shown in Table 2
Polishing machine: single-sided polishing machine, model number SPM-15 available from Fujikoshi Machinery Corp.
Polishing pressure: 150 g/cm²
Platen rotational speed: 40 rpm
Head rotational speed: 40 rpm
Polishing pad: product name Supreme RN-H, suede type, available from Nitta Haas Inc.
Supply flow rate: 0.5 L/min (one-way)
Temperature maintained in polishing environment: 20° C.
Polishing time: first sub-step for 7 minutes followed by second sub-step for 3 minutes
(In Examples 8 to 11, the first sub-step was continued for 10 minutes and the second sub-step was not performed.)

In particular, the final polishing step was carried out as described below.

Example 1

A silicon substrate was set in the polishing machine Supplying Slurry C, the first-sub-step polishing was started. At 7 minutes after the start of the first sub-step, the slurry being supplied was switched from Slurry C to Slurry A and the second-sub-step polishing was subsequently carried out. At 3 minutes after the start of the second sub-step, the supply of Slurry A and the operation of the polishing machine were stopped.

Examples 2 to 7, 12, 13

The slurry supplied in the first sub-step was changed as shown in Table 2. Otherwise in the same manner as Example 1, final polishing was performed on silicon substrates.

Examples 8 to 11

Silicon substrates were set in the polishing machine Supplying slurries shown in Table 2, polishing was started. At 10 minutes after the start of polishing, the supply of slurries and the operation of the polishing machine were stopped.

Upon completion of the final polishing, the silicon substrates were removed from the polishing machine and cleaned in the same manner as the cleaning after the stock polishing. Finished silicon waters according to Examples 1 to 13 were thus obtained.

3. Evaluations (Determination of Haze Level)

Using a wafer surface defect tester under product name AWIS 3110 available from ADE Corporation, haze levels (ppm) of final-polished silicon wafers according to Examples 1 to 11 were determined. The results are shown in the "Haze" column in Table 2.

(Determination of Polishing Removal Rate)

Based on differences in weight and polished surface area of final-polished silicon substrates, the polished thicknesses (the polishing removal) in the final polishing step were determined and divided by the polishing time (10 minutes, here) to determine the average polishing removal per unit time (polishing removal rate). With respect to each type of silicon substrate, the resulting value was converted to a relative value with the polishing removal rate of Example 1 being 1.00. The results are shown in the "Polishing removal rate" column in Table 2.

For each of Examples 1 to 10, 12 and 13, the polishing removal rate (nm/min) of P− substrate was divided by the polishing removal rate (nm/min) of P+++ substrate to determine the polishing removal rate ratio P− substrate/P+++ substrate (i.e. the ratio of polishing removal rate of P− substrate to polishing removal rate of P+++ substrate). The results are shown in the "Polishing removal rate ratio" in Table 2.

With respect to each Example shown in Table 2, the symbol "-" in the haze and polishing removal rate columns indicate that no polishing tests were performed with respect to that particular kind of silicon substrate.

It is noted that when silicon substrates were polished using Slurries D, E and G to K in place of Slurry A in Example 8 and polishing removal rate was determined in the same manner as above, as shown in Table 3, all showed superior polishing removal rate to Slurry A.

silicon wafers with varied resistivity. As compared to Examples 1 to 3 and 7 using Slurries C to E and I, with respect to Examples 4 to 6 using Slurries F to H, the resulting surfaces had a tendency of showing yet lower haze levels. As compared to Example 8 where polishing was performed only with Slurry A, in Examples 1 to 7, 12 and 13, the polishing removal rate was higher by a factor of about 2 in polishing P+++ substrates. As evident from comparison of polishing removal rate ratios of Examples 1 to 7, 12 and 13 against that of Example 8, in Examples 1 to 7, 12 and 13, differences in polishing removal rate attributed to resistivity of silicon wafers were less significant than in Example 8.

On the other hand, in Example 11 where polishing was performed only with Slurry B, while the polishing removal rate was high, the effect to reduce haze level was insufficient in polishing the P− substrate or the P++ substrate. With respect to Examples 9 and 10 where polishing was performed only with Slurry C or Slurry F, haze levels were not sufficiently reduced in polishing P− substrates.

Although specific embodiments of the present invention have been described in detail above, these are merely for illustrations and do not limit the scope of the claims. The art

TABLE 2

| Sample | | P− | | P++ | | P+++ | | Polishing removal rate ratio (P−/P+++) |
|---|---|---|---|---|---|---|---|---|
| 1st stage (7 min) | 2nd stage (3 min) | Haze (ppm) | Polishing removal rate (relative value) | Haze (ppm) | Polishing removal rate (relative value) | Haze (ppm) | Polishing removal rate (relative value) | |
| Ex. 1 | C | A | 0.05 | 1.00 | 0.15 | 1.00 | 0.06 | 1.00 | 5.3 |
| Ex. 2 | D | A | 0.05 | 1.02 | — | — | 0.06 | 1.10 | 4.9 |
| Ex. 3 | E | A | 0.05 | 1.43 | — | — | 0.06 | 1.00 | 7.6 |
| Ex. 4 | F | A | 0.04 | 1.02 | 0.15 | 1.00 | 0.04 | 0.96 | 5.6 |
| Ex. 5 | G | A | 0.05 | 1.15 | — | — | 0.05 | 1.10 | 5.5 |
| Ex. 6 | H | A | 0.05 | 1.15 | — | — | 0.05 | 1.00 | 6.1 |
| Ex. 7 | I | A | 0.05 | 1.08 | 0.17 | 1.00 | 0.06 | 1.00 | 5.7 |
| Ex. 8 | A | | 0.04 | 0.85 | 0.15 | 0.73 | 0.04 | 0.48 | 9.4 |
| Ex. 9 | C | | 0.18 | 1.03 | 0.16 | 1.00 | 0.04 | 1.00 | 5.5 |
| Ex. 10 | F | | 0.18 | 1.03 | 0.16 | 1.00 | 0.04 | 1.00 | 5.5 |
| Ex. 11 | B | | 1.00 | 4.70 | 1.00 | 4.30 | — | — | — |
| Ex. 12 | J | A | 0.05 | 1.04 | — | — | 0.06 | 1.20 | 4.6 |
| Ex. 13 | K | A | 0.05 | 1.00 | — | — | 0.05 | 1.03 | 5.1 |

TABLE 3

| | Polishing removal rate (nm/min) | | |
|---|---|---|---|
| Slurry | P− | P++ | P+++ |
| A | 45 | 35 | 5 |
| B | 249 | 206 | — |
| C | 55 | 48 | 10 |
| D | 54 | — | 11 |
| E | 62 | — | 10 |
| F | 55 | 48 | 10 |
| G | 61 | — | 11 |
| H | 61 | — | 10 |
| I | 65 | — | 10 |
| J | 63 | — | 13 |
| K | 55 | — | 10 |

As shown in Table 1, with respect to Examples 1 to 7, 12 and 13 where the first-sub-step and second-sub-step polishing were carried out with the water-soluble polymer $P_1$-containing slurries C to K for the first sub-step switched to slurries with low polishing removal rate for the second sub-step, the same polishing process produced surfaces with haze levels about as low as Example 8 even in polishing according to the claims includes various modifications and changes made to the specific embodiments illustrated above.

The invention claimed is:

1. A method for polishing silicon substrates consisting of a high-resistivity silicon substrate having a resistivity of 1 Ω·cm or greater and a low-resistivity silicon substrate having a resistivity less than 0.005 Ω·cm, the method comprising a stock polishing step and a final polishing step for each of the high-resistivity silicon substrate and the low-resistivity silicon substrate, wherein the final polishing step is a step polishing only a single side of each of the high-resistivity silicon substrate and the low-resistivity silicon substrate, the final polishing step comprising:
supplying a first polishing slurry $S_1$ and a second polishing slurry $S_2$ to the silicon substrate to be polished, switching them in this order midway through polishing a single side of the silicon substrate,
wherein the first polishing slurry $S_1$ comprises an abrasive $A_1$, a water-soluble polymer $P_1$, and a basic compound $B_1$, wherein:
the abrasive $A_1$ has a BET diameter of 5 nm or greater and 100 nm or less and a true specific gravity of 1.5 or higher and 2.3 or lower, and a content of the abrasive $A_1$ in the first polishing slurry $S_1$ is 0.05% by weight or higher and 10% by weight or lower;

the water-soluble polymer $P_1$ is a mixture of a water-soluble polymer having a vinyl alcohol-based polymer chain and a water-soluble polymer having an N-vinyl-based polymer chain, or the water-soluble polymer $P_1$ is a copolymer having the vinyl alcohol-based polymer chain and the N-vinyl-based polymer chain in the same molecule, a content of the vinyl alcohol-based polymer chain in the water-soluble polymer $P_1$ is 50% by weight or higher and an amount of the water-soluble polymer $P_1$ per 1 g of abrasive $A_1$ contained in the first polishing slurry $S_1$ is 0.03 g or less;

the basic compound $B_1$ is an alkali metal hydroxide comprising potassium hydroxide;

the first polishing slurry has a pH of 8.0 or higher and 12.0 or lower; and the first polishing slurry $S_1$ shows higher polishing removal rate than the second polishing slurry $S_2$; and wherein:

the first polishing slurry $S_1$ for polishing the low-resistivity silicon substrate in the final polishing step has the same composition as the first polishing slurry $S_1$ for polishing the high-resistivity silicon substrate in the final polishing step;

the second polishing slurry $S_2$ for polishing the low-resistivity silicon substrate in the final polishing step has the same composition as the second polishing slurry $S_2$ for polishing the high-resistivity silicon substrate in the final polishing step; and the first polishing slurry $S_1$ shows a first polishing removal rate for polishing the high-resistivity silicon substrate and a second polishing removal rate for polishing the low-resistivity silicon substrate, wherein the first polishing removal rate is less than or equal to 6.2 times the second polishing removal rate.

2. The polishing method according to claim 1, wherein the first polishing slurry $S_1$ comprises at least 0.001% water-soluble polymer $P_1$ by weight.

3. The polishing method according to claim 1, wherein the abrasive $A_1$ has a BET diameter of 5 nm or greater and smaller than 60 nm.

4. The polishing method according to claim 1, wherein the second polishing slurry $S_2$ comprises an abrasive $A_2$ and a water-soluble polymer $P_2$, and the concentration of the water-soluble polymer $P_2$ in the second polishing slurry $S_2$ is higher than the concentration of the water-soluble polymer $P_1$ in the first polishing slurry $S_1$.

5. The polishing method according to claim 1, wherein the second polishing slurry $S_2$ comprises an abrasive $A_2$, and the abrasive $A_2$ content in the second polishing slurry $S_2$ is 0.5% by weight or lower.

6. A polishing composition used in the polishing method according to claim 1, wherein the polishing composition is the first polishing slurry $S_1$ or a concentrate thereof.

7. A polishing composition used in the polishing method according to claim 1, wherein the polishing composition is the second polishing slurry $S_2$ or a concentrate thereof.

8. A polishing composition set used in the polishing method according to claim 1, the polishing composition set comprising the first polishing slurry $S_1$ or a first composition $Q_1$ which is a concentrate of $S_1$, and the second polishing slurry $S_2$ or a second composition $Q_2$ which is a concentrate of $S_2$;

wherein the first composition $Q_1$ and the second composition $Q_2$ are separately stored.

9. The method of claim 1, wherein the water-soluble polymer $P_1$ has a weight average molecular weight (Mw) of $20 \times 10^4$ or lower.

10. The method of claim 1, wherein the water-soluble polymer $P_1$ is the mixture of a water-soluble polymer having the vinyl alcohol-based polymer chain and the water-soluble polymer having the N-vinyl-based polymer chain.

11. The method of claim 10, wherein the water-soluble polymer having the vinyl alcohol-based polymer chain has a weight average molecular weight (Mw) of $20 \times 10^4$ or lower, and the water-soluble polymer having the N-vinyl-based polymer chain has a Mw of $3 \times 10^4$ or higher but lower than the Mw of the water-soluble polymer having the vinyl alcohol-based polymer chain.

12. The method of claim 1, wherein the water-soluble polymer $P_1$ is the copolymer having the vinyl alcohol-based polymer chain and the N-vinyl-based polymer chain in one same molecule.

13. A method for polishing silicon substrates consisting of a high-resistivity silicon substrate having a resistivity of 1 Ω·cm or greater and a low-resistivity silicon substrate having a resistivity less than 0.005 Ω·cm, the method comprising a stock polishing step and a final polishing step for each of the high-resistivity silicon substrate and the low-resistivity silicon substrate, wherein the final polishing step is a step polishing only a single side of each of the high-resistivity silicon substrate and the low-resistivity silicon substrate, the final polishing step comprising:

supplying a first polishing slurry $S_1$ and a second polishing slurry $S_2$ to the silicon substrate to be polished, switching them in this order midway through polishing a single side of the silicon substrate, wherein the first polishing slurry $S_1$ comprises an abrasive $A_1$, a water-soluble polymer $P_1$, and a basic compound $B_1$, wherein:

the abrasive $A_1$ has a BET diameter of 5 nm or greater and 100 nm or less and a true specific gravity of 1.5 or higher and 2.3 or lower, and a content of the abrasive $A_1$ in the first polishing slurry $S_1$ is 0.05% by weight or higher and 10% by weight or lower;

the water-soluble polymer $P_1$ is a mixture of a water-soluble polymer having a vinyl alcohol-based polymer chain and a water-soluble polymer having an N-vinyl-based polymer chain, or the water-soluble polymer $P_1$ is a copolymer having the vinyl alcohol-based polymer chain and the N-vinyl-based polymer chain in the same molecule, the N-vinyl-based polymer chain is a vinylpyrrolidone-based polymer and an amount of the water-soluble polymer $P_1$ per 1 g of abrasive $A_1$ contained in the first polishing slurry $S_1$ is 0.03 g or less;

the basic compound $B_1$ is an alkali metal hydroxide comprising potassium hydroxide;

the first polishing slurry $S_1$ has a pH of 8.0 or higher and 12.0 or lower; and the first polishing slurry $S_1$ shows higher polishing removal rate than the second polishing slurry $S_2$; and wherein:

the first polishing slurry $S_1$ for polishing the low-resistivity silicon substrate in the final polishing step has the same composition as the first polishing slurry $S_1$ for polishing the high-resistivity silicon substrate in the final polishing step;

the second polishing slurry $S_2$ for polishing the low-resistivity silicon substrate in the final polishing step has the same composition as the second polishing slurry $S_2$ for polishing the high-resistivity silicon substrate in the final polishing step; and the first polishing slurry $S_1$ shows a first polishing removal rate for polishing the high-resistivity silicon substrate and a second polishing removal rate for polishing the low-resistivity silicon substrate, wherein the first polishing removal rate is less than or equal to 6.2 times the second polishing removal rate.

* * * * *